United States Patent
Yabu

(10) Patent No.: US 10,869,378 B2
(45) Date of Patent: Dec. 15, 2020

(54) TARGET MEASURING APPARATUS AND EXTREME ULTRAVIOLET LIGHT GENERATION APPARATUS

(71) Applicant: Gigaphoton Inc., Tochigi (JP)

(72) Inventor: Takayuki Yabu, Oyama (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 16/595,610

(22) Filed: Oct. 8, 2019

(65) Prior Publication Data

US 2020/0037429 A1  Jan. 30, 2020

Related U.S. Application Data

(63) Continuation of application No. PCT/JP2017/018150, filed on May 15, 2017.

(51) Int. Cl.
*H05G 2/00* (2006.01)

(52) U.S. Cl.
CPC ............ *H05G 2/006* (2013.01); *H05G 2/008* (2013.01)

(58) Field of Classification Search
CPC .......... H05G 2/00; H05G 2/001; H05G 2/006; H05G 2/008
USPC ...................................................... 250/504 R
See application file for complete search history.

(56) References Cited

U.S. PATENT DOCUMENTS

| 7,718,985 B1* | 5/2010 | Bernath | H05G 2/008 |
| | | | 250/573 |
| 10,141,186 B2 | 11/2018 | Hosoda et al. | |
| 2013/0026393 A1* | 1/2013 | Abe | H05G 2/008 |
| | | | 250/504 R |
| 2014/0091239 A1* | 4/2014 | van der Burgt | H05G 2/008 |
| | | | 250/504 R |
| 2016/0234920 A1* | 8/2016 | Suzuki | H05G 2/008 |
| 2018/0177036 A1 | 6/2018 | Hosoda et al. | |

FOREIGN PATENT DOCUMENTS

| JP | 2002-286546 A | 10/2002 | |
| WO | 2016/147910 A1 | 9/2016 | |
| WO | 2017/042881 A1 | 3/2017 | |
| WO | WO-2017042881 A1 * | 3/2017 | ............ H05G 2/006 |

OTHER PUBLICATIONS

International Preliminary Report on Patentability and Written Opinion issued in PCT/JP2017/018150; dated Nov. 19, 2019.
International Search Report issued in PCT/JP2017/018150; dated Aug. 15, 2017.

* cited by examiner

*Primary Examiner* — Jason L McCormack
(74) *Attorney, Agent, or Firm* — Studebaker & Brackett PC

(57) ABSTRACT

A target measuring apparatus includes: an image capturing unit configured to capture a picture image of a target output from a target supply unit; a moving unit configured to move at least a part of the image capturing unit; and a control unit configured to perform a first process of updating information on a coordinate system in the picture image based on an amount of movement of the image capturing unit by the moving unit, and a second process of measuring a parameter of the target based on the image captured by the image capturing unit and the information on the coordinate system. Updating the information on the coordinate system can calibrate a deviation of a measurement result of the target due to movement of the image capturing unit.

20 Claims, 11 Drawing Sheets

S20
MEASURE POSITION OF DROPLET BASED ON INFORMATION ON COORDINATE SYSTEM

S40
CALCULATE CHANGED POSITION OF DROPLET IMAGE IN PICTURE IMAGE

S63
MOVE TARGET SENSOR TO MOVE AREA OF PICTURE IMAGE

S64
UPDATE INFORMATION ON COORDINATE SYSTEM

S80
CONTROL TARGET SUPPLY UNIT ACTUATOR TO CHANGE POSITION OF DROPLET

INITIAL PICTURE IMAGE

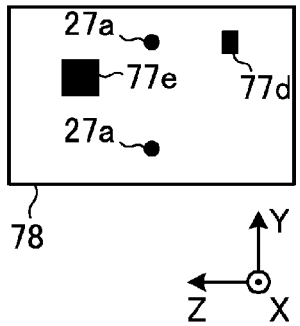

Fig. 13A

CAPTURE IMAGE WITH POSITIONS OF DROPLETS BEING CHANGED

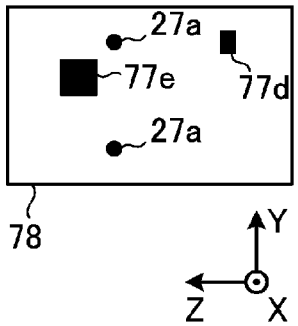

Fig. 13B

ELIMINATE CHANGED AREAS AND EXTRACT MEASUREMENT IMPOSSIBLE REGIONS

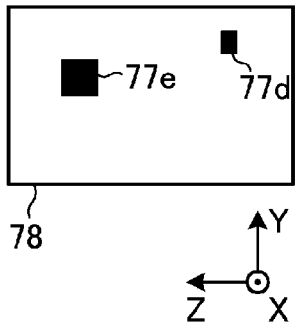

Fig. 13C

INITIAL PICTURE IMAGE

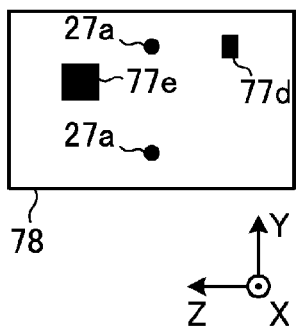

Fig. 14A

CAPTURE IMAGE WITH POSITIONS OF DROPLETS BEING CHANGED OUTSIDE PICTURE IMAGE

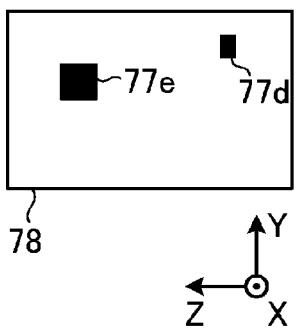

Fig. 14B

EXTRACT MEASUREMENT IMPOSSIBLE REGIONS

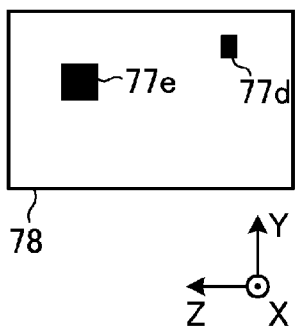

Fig. 14C

INITIAL PICTURE IMAGE

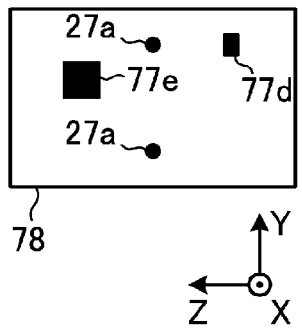

Fig. 15A

CAPTURE IMAGE WITH SUPPLY OF DROPLETS BEING STOPPED

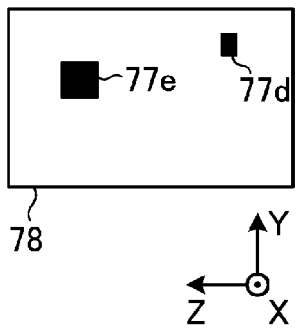

Fig. 15B

EXTRACT MEASUREMENT IMPOSSIBLE REGIONS

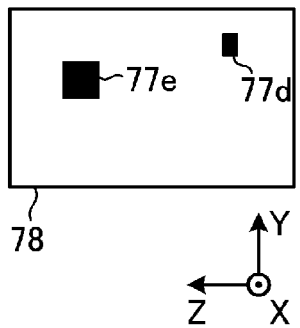

Fig. 15C

TARGET MEASURING APPARATUS AND EXTREME ULTRAVIOLET LIGHT GENERATION APPARATUS

CROSS-REFERENCE TO RELATED APPLICATIONS

The present application is a continuation application of International Application No. PCT/JP2017/018150 filed on May 15, 2017. The content of the application is incorporated herein by reference in its entirety.

BACKGROUND

1. Technical Field

The present disclosure relates to a target measuring apparatus and an extreme ultraviolet light generation apparatus.

2. Related Art

Recently, miniaturization of semiconductor processes has involved rapidly increasing miniaturization of transfer patterns for use in photolithography of the semiconductor processes. In the next generation, microfabrication at 70 nm to 45 nm and further microfabrication at 32 nm or less will be required. Thus, to satisfy the requirement for the microfabrication at 32 nm or less, development of an exposure apparatus is expected including a combination of an extreme ultraviolet light generation apparatus configured to generate extreme ultraviolet (EUV) light having a wavelength of about 13 nm and reduced projection reflection optics.

Three types of EUV light generation apparatuses have been proposed: an LPP (Laser Produced Plasma) type apparatus using plasma generated by irradiating a target substance with a pulse laser beam, a DPP (Discharge Produced Plasma) type apparatus using plasma generated by discharge, and an SR (Synchrotron Radiation) type apparatus using synchrotron radiation.

LIST OF DOCUMENTS

Patent Document

Patent Document 1: Japanese Unexamined Patent Application Publication No. 2002-286546

SUMMARY

A target measuring apparatus according to an aspect of the present disclosure includes: an image capturing unit configured to capture a picture image of a target output from a target supply unit; a moving unit configured to move at least a part of the image capturing unit; and a control unit configured to perform a first process of updating information on a coordinate system in the picture image based on an amount of movement of the image capturing unit by the moving unit, and a second process of measuring a parameter of the target based on the picture image captured by the image capturing unit and the information on the coordinate system.

An extreme ultraviolet light generation apparatus according to an aspect of the present disclosure includes: a chamber; a target supply unit configured to output a target into the chamber; an image capturing unit configured to capture a picture image of the target output from the target supply unit; a moving unit configured to move at least a part of the image capturing unit; and a control unit configured to perform a first process of updating information on a coordinate system in the picture image based on an amount of movement of the image capturing unit by the moving unit, and a second process of measuring a parameter of the target based on the picture image captured by the image capturing unit and the information on the coordinate system.

BRIEF DESCRIPTION OF THE DRAWINGS

With reference to the accompanying drawings, some embodiments of the present disclosure will be described below merely by way of example.

FIGS. 13A and 13B show examples of picture images in a sixth embodiment of the present disclosure. FIG. 13C shows examples of measurement impossible regions extracted based on the picture images in FIGS. 13A and 13B.

FIGS. 14A and 14B show examples of picture images in a first variant of the sixth embodiment. FIG. 14C shows examples of measurement impossible regions extracted based on the picture image in FIG. 14B.

FIGS. 15A and 15B show examples of picture images in a second variant of the sixth embodiment. FIG. 15C shows examples of measurement impossible regions extracted based on the picture image in FIG. 15B.

DESCRIPTION OF EMBODIMENTS

Figure 1:
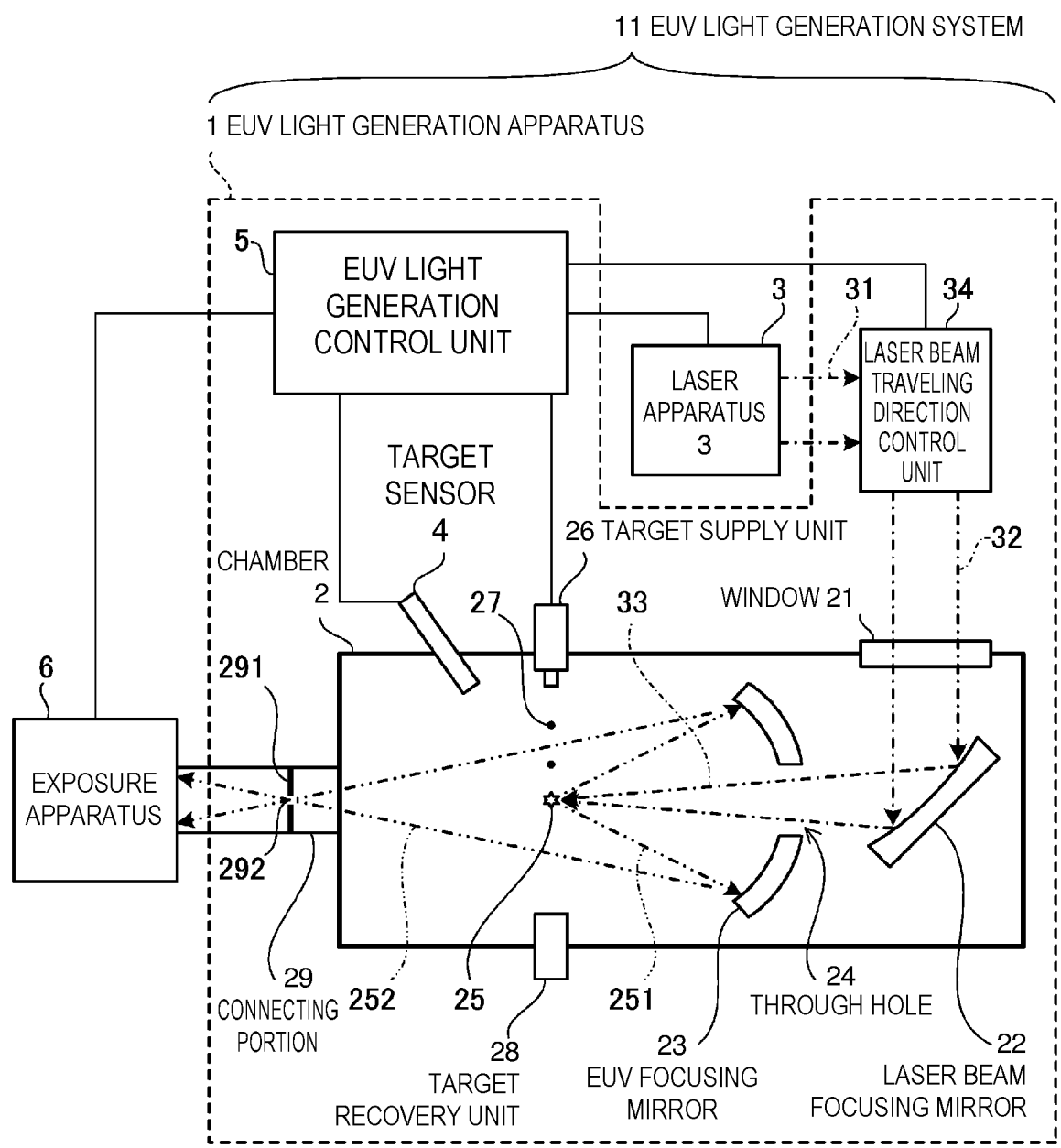
FIG. 1 schematically shows a configuration of an exemplary LPP type EUV light generation system.

<Contents>
1. General description of extreme ultraviolet light generation system
   1.1 Configuration
   1.2 Operation 2. EUV light generation system according to comparative example
  2.1 Configuration
    2.1.1 Target supply unit
    2.1.2 Laser apparatus
    2.1.3 Laser beam traveling direction control unit
    2.1.4 Laser beam focusing optical system and EUV focusing mirror
    2.1.5 Target sensor
  2.2 Operation
    2.2.1 Output of droplet 27a
    2.2.2 Output of pulse laser beam
    2.2.3 Transmission of pulse laser beam
    2.2.4 Focusing of pulse laser beam
    2.2.5 Detection of target position
  2.3 Problem
3. EUV light generation system configured to move target sensor 80
  3.1 Configuration
  3.2 Operation
    3.2.1 Main flow
    3.2.2 Process of moving target sensor 80
  3.3 Effect
4. EUV light generation system configured to determine moving direction of target sensor 80
5. EUV light generation system configured to integrally move target sensor 80
6. EUV light generation system configured to move image sensor 80d
7. EUV light generation system configured to move optical system of target sensor 80
8. EUV light generation system configured to update information on measurement impossible region
9. Supplementation Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. Like components are denoted by like reference numerals, and overlapping descriptions are omitted.

1. GENERAL DESCRIPTION OF EXTREME ULTRAVIOLET LIGHT GENERATION SYSTEM 1.1 Configuration FIG. 1 schematically shows a configuration of an exemplary LPP type EUV light generation system. An EUV light generation apparatus 1 is used together with at least one laser apparatus 3. In this application, a system including the EUV light generation apparatus 1 and the laser apparatus 3 is referred to as an EUV light generation system 11. As shown in FIG. 1 and described below in detail, the EUV light generation apparatus 1 includes a chamber 2 and a target supply unit 26. The chamber 2 is configured to be sealable. The target supply unit 26 is mounted, for example, to extend through a wall of the chamber 2. A material of a target substance output from the target supply unit 26 may include tin, terbium, gadolinium, lithium, xenon, or any combinations of two or more of them, but not limited to them.

The wall of the chamber 2 has at least one through hole. A window 21 is provided in the through hole. A pulse laser beam 32 output from the laser apparatus 3 passes through the window 21. In the chamber 2, an EUV focusing mirror 23 having, for example, a spheroidal reflection surface is arranged. The EUV light focusing mirror 23 has first and second focal points. On a surface of the EUV focusing mirror 23, a multilayer reflective film including, for example, alternately stacked molybdenum and silicon is formed. The EUV focusing mirror 23 is arranged so that, for example, the first focal point is located in a plasma generating region 25 and the second focal point is located in an intermediate focal (IF) point 292. A through hole 24 is provided in a center of the EUV focusing mirror 23. A pulse laser beam 33 passes through the through hole 24.

The EUV light generation apparatus 1 includes an EUV light generation control unit 5, a target sensor 4, and the like. The target sensor 4 has an imaging function, and is configured to detect presence, a trajectory, a position, a speed, or the like of a target 27.

The EUV light generation apparatus 1 includes a connecting portion 29 configured to provide communication between an interior of the chamber 2 and an interior of an exposure apparatus 6. In the connecting portion 29, a wall 291 having an aperture is provided. The wall 291 is arranged so that the aperture is located in a second focal position of the EUV focusing mirror 23.

Further, the EUV light generation apparatus 1 includes a laser beam traveling direction control unit 34, a laser beam focusing mirror 22, a target recovery unit 28 for recovering the target 27, and the like. The laser beam traveling direction control unit 34 includes an optical element for defining a traveling direction of a laser beam, and an actuator for adjusting a position, an orientation, or the like of the optical element.

1.2 Operation

With reference to FIG. 1, a pulse laser beam 31 output from the laser apparatus 3 passes through the laser beam traveling direction control unit 34 and passes through the window 21 as the pulse laser beam 32, which enters the chamber 2. The pulse laser beam 32 travels along at least one laser beam path in the chamber 2, is reflected by the laser beam focusing mirror 22, and is applied as the pulse laser beam 33 to at least one target 27.

The target supply unit 26 outputs the target 27 toward the plasma generating region 25 in the chamber 2. The target 27 is irradiated with at least one pulse included in the pulse laser beam 33. The target 27 irradiated with the pulse laser beam is turned into plasma, and radiation light 251 is radiated from the plasma. The EUV focusing mirror 23 reflects EUV light included in the radiation light 251 with higher reflectance than light in a different wavelength range. Reflected light 252 including the EUV light reflected by the EUV focusing mirror 23 is focused on the intermediate focal point 292 and output to the exposure apparatus 6. One target 27 may be irradiated with a plurality of pulses included in the pulse laser beam 33.

The EUV light generation control unit 5 collectively controls the entire EUV light generation system 11. The EUV light generation control unit 5 processes image date or the like of the target 27 captured by the target sensor 4. Also, the EUV light generation control unit 5 controls, for example, output timing of the target 27, an output direction of the target 27, or the like. Further, the EUV light generation control unit 5 controls, for example, oscillation timing of the laser apparatus 3, a traveling direction of the pulse laser beam 32, a focusing position of the pulse laser beam 33, or the like. These various controls are mere examples, and other controls may be added as required.

2. EUV LIGHT GENERATION SYSTEM ACCORDING TO COMPARATIVE EXAMPLE

2.1 Configuration

Figure 2:
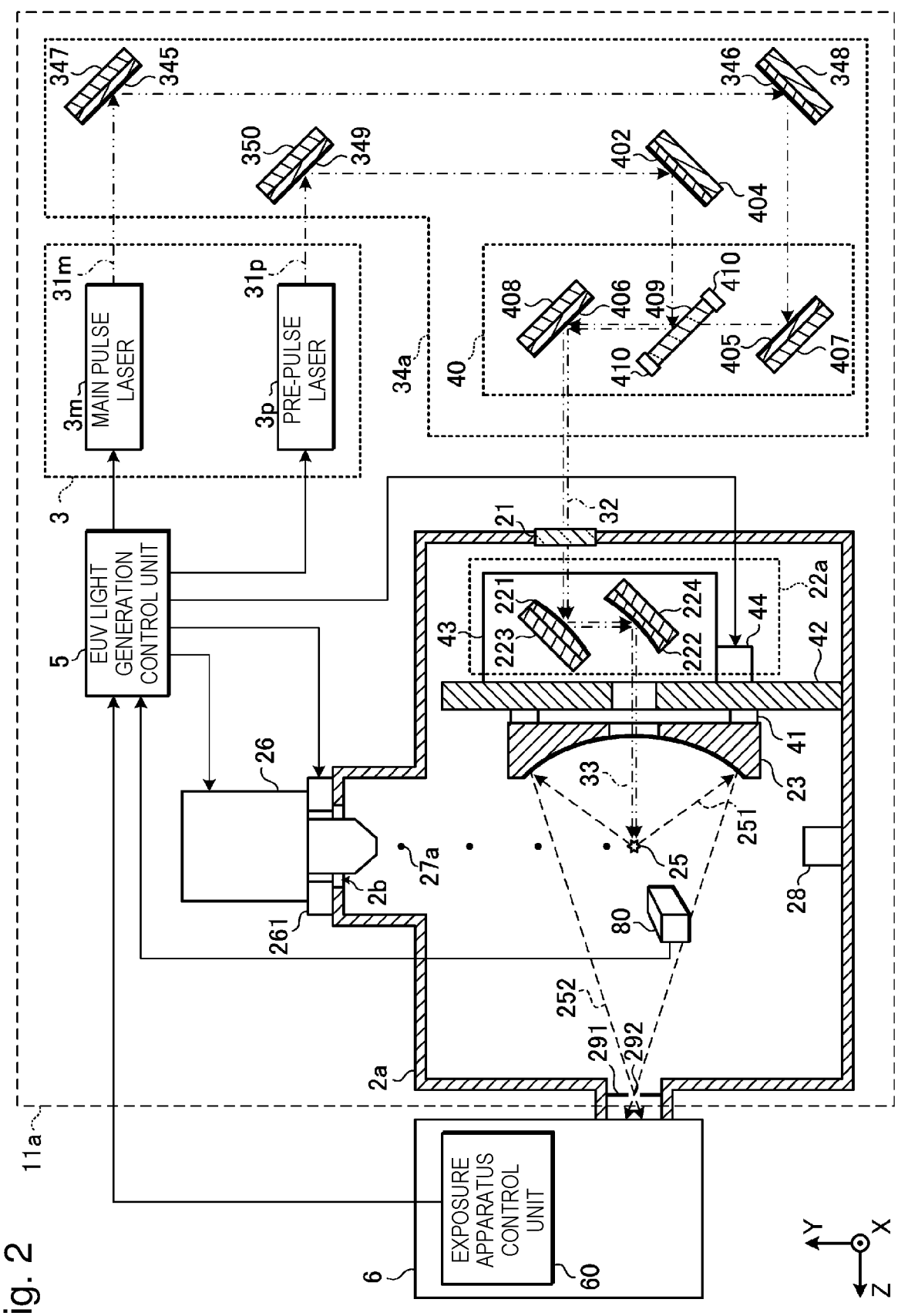
FIG. 2 is a partial sectional view of a configuration of an EUV light generation system 11a according to a comparative example.
Figure 3A:
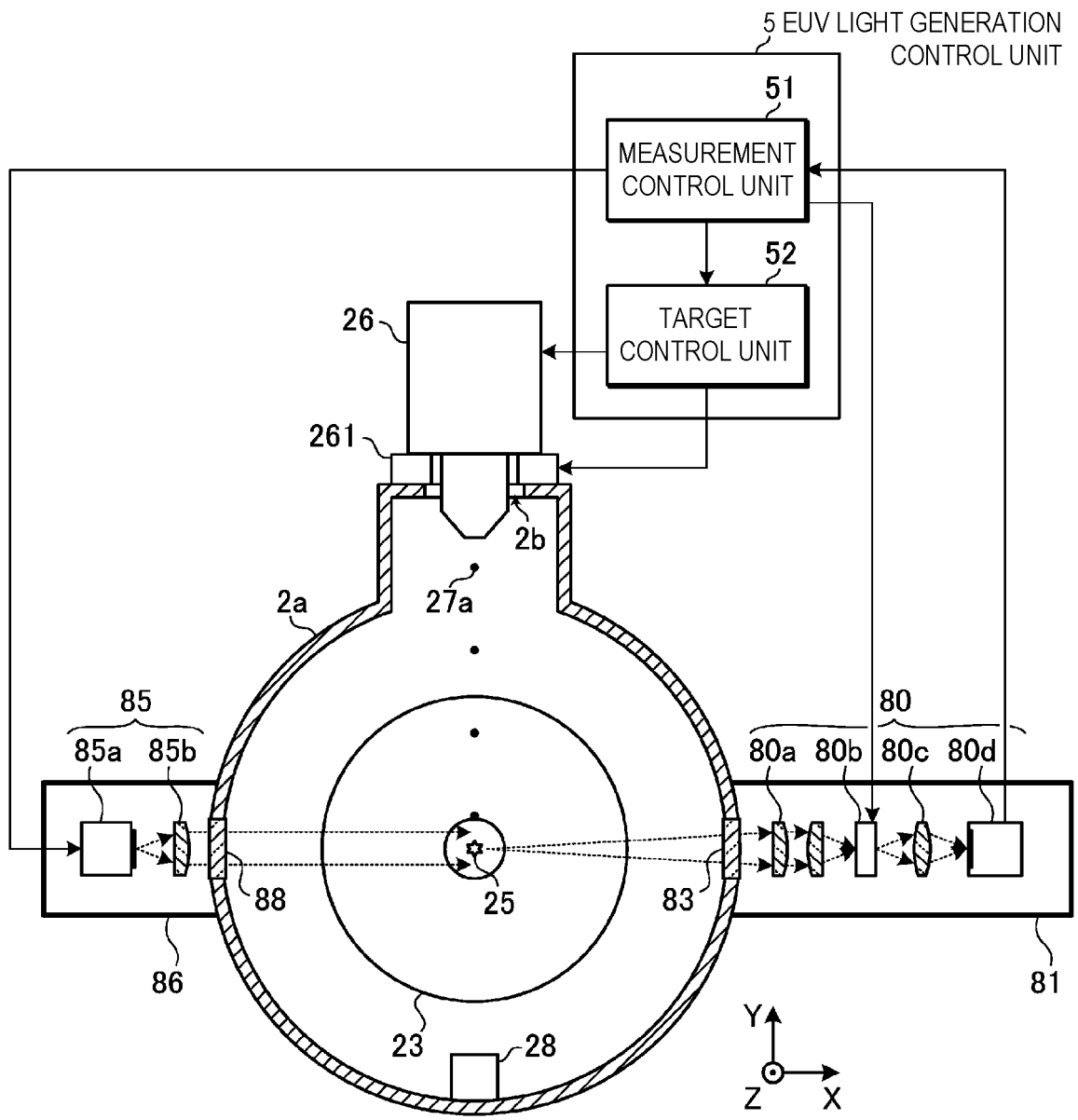
FIG. 3A is a partial sectional view of the configuration of the EUV light generation system 11a according to the comparative example.

FIGS. 2 and 3A are partial sectional views of a configuration of an EUV light generation system 11a according to a comparative example. As shown in FIGS. 2 and 3A, an output direction of EUV light is a +Z direction. A direction opposite to an output direction of a droplet 27a that is a drop-like target is a +Y direction. Directions perpendicular to the +Z direction and the +Y direction are a +X direction and a −X direction. FIG. 2 shows the EUV light generation system 11a seen in the −X direction from a position in the +X direction. FIG. 3 shows the EUV light generation system 11a seen in the −Z direction from a position in the +Z direction.

In the chamber 2a, a laser beam focusing optical system 22a, an EUV focusing mirror 23, a target recovery unit 28, an EUV focusing mirror holder 41, and plates 42, 43 are provided. A target supply unit 26, a target sensor 80, and an illumination unit 85 are mounted to the chamber 2a.

Outside the chamber 2a, a laser apparatus 3, a laser beam traveling direction control unit 34a, and an EUV light generation control unit 5 are provided. The EUV light generation control unit 5 includes a measurement control unit 51 and a target control unit 52.

2.1.1 Target Supply Unit

The target supply unit 26 is arranged to extend through a through hole 2b formed in a wall surface of the chamber 2a. The target supply unit 26 is mounted to the chamber 2a via a target supply unit actuator 261. The target supply unit actuator 261 is a biaxial stage for moving a position of the target supply unit 26 relative to the chamber 2a in the +Z direction, the −Z direction, the +X direction, and the −X direction. Sealing means (not shown) is arranged between the wall surface of the chamber 2a around the through hole 2b and the target supply unit 26. The sealing means seals between the wall surface of the chamber 2a around the through hole 2b and the target supply unit 26.

The target supply unit 26 holds a melted target material. The target supply unit 26 has an opening (not shown) located in the chamber 2a. A vibrating device (not shown) is arranged near the opening of the target supply unit 26.

The target control unit 52 receives a parameter described later from the measurement control unit 51. The parameter includes a position of the droplet 27a at a predetermined timing. Examples of the position of the droplet 27a at the predetermined timing include a position in the X direction, a position in the Y direction, and a position in the Z direction. The target control unit 52 controls the target supply unit actuator 261 based on the parameter. Controlling the target supply unit actuator 261 can adjust a trajectory of the droplet 27a so that the droplet 27a passes through a plasma generating region 25.

2.1.2 Laser Apparatus

The laser apparatus 3 includes a pre-pulse laser 3p and a main pulse laser 3m. The pre-pulse laser 3p is configured to output a pre-pulse laser beam 31p. The main pulse laser 3m is configured to output a main pulse laser beam 31m. The pre-pulse laser 3p is constituted by, for example, a YAG laser apparatus or a laser apparatus using $Nd:YVO_4$. The main pulse laser 3m is constituted by, for example, a $CO_2$ laser apparatus. The pre-pulse laser 3p and the main pulse laser 3m each include a laser oscillator and, as required, a laser amplifier. The YAG laser apparatus uses a YAG crystal as a laser medium in one or both of the laser oscillator and the laser amplifier. The $CO_2$ laser apparatus uses a $CO_2$ gas as a laser medium in one or both of the laser oscillator and the laser amplifier.

2.1.3 Laser Beam Traveling Direction Control Unit

The laser beam traveling direction control unit 34a includes high reflection mirrors 349, 402. The high reflection mirrors 349, 402 are arranged in an optical path of the pre-pulse laser beam 31p. The high reflection mirror 349 is supported by a holder 350. The high reflection mirror 402 is supported by a holder 404. An actuator (not shown) may be mounted to each of the holders 350, 404.

The laser beam traveling direction control unit 34a further includes high reflection mirrors 345, 346. The high reflection mirrors 345, 346 are arranged in an optical path of the main pulse laser beam 31m. The high reflection mirror 345 is supported by a holder 347. The high reflection mirror 346 is supported by a holder 348. An actuator (not shown) may be mounted to each of the holders 347, 348.

The laser beam traveling direction control unit 34a further includes a beam combiner module 40. The beam combiner module 40 includes high reflection mirrors 405, 406 and a beam combiner 409.

The high reflection mirror 405 is arranged in an optical path of the main pulse laser beam 31m reflected by the high reflection mirror 346. The high reflection mirror 405 is supported by a holder 407.

The beam combiner 409 is located in an optical path of the pre-pulse laser beam 31p reflected by the high reflection mirror 402. The beam combiner 409 is located in an optical path of the main pulse laser beam 31m reflected by the high reflection mirror 405. The beam combiner 409 is supported by a holder 410. The beam combiner 409 is constituted by, for example, a dichroic mirror. The beam combiner 409 is configured to reflect the pre-pulse laser beam 31p with high reflectance and transmit the main pulse laser beam 31m with high transmittance. The beam combiner 409 is configured to substantially match optical path axes of the pre-pulse laser beam 31p and the main pulse laser beam 31m. The optical path axis refers to a central axis of an optical path.

The high reflection mirror 406 is arranged in optical paths of the pre-pulse laser beam 31p reflected by the beam combiner 409 and the main pulse laser beam 31m having passed through the beam combiner 409. The high reflection mirror 406 is supported by a holder 408. The high reflection mirror 406 is configured to reflect the pre-pulse laser beam 31p and the main pulse laser beam 31m inward of the chamber 2a. The pre-pulse laser beam 31p and the main pulse laser beam 31m reflected by the high reflection mirror 406 are herein sometimes collectively referred to as a pulse laser beam 32.

2.1.4 Laser Beam Focusing Optical System and EUV Focusing Mirror

The plate 42 is secured to the chamber 2a. The EUV focusing mirror 23 is secured to the plate 42 via the EUV focusing mirror holder 41.

The plate 42 supports the plate 43 and a laser beam focusing optical system actuator 44. The laser beam focusing optical system 22a includes an off-axis parabolic convex mirror 221 and an ellipsoidal concave mirror 222. The off-axis parabolic convex mirror 221 is supported by a holder 223. The ellipsoidal concave mirror 222 is supported by a holder 224. The holders 223, 224 are supported by the plate 43.

The off-axis parabolic convex mirror 221 is a mirror having a convex surface of a paraboloid of revolution as a reflection surface. The off-axis parabolic convex mirror 221 is arranged so that an axis of the paraboloid of revolution is substantially parallel to an optical path axis of the pulse laser beam 32 entering the off-axis parabolic convex mirror 221.

The ellipsoidal concave mirror 222 is a mirror having a concave surface of a spheroid as a reflection surface. The ellipsoidal concave mirror 222 has first and second focal points. The ellipsoidal concave mirror 222 is arranged so that a focal point of the off-axis parabolic convex mirror 221 substantially matches the first focal point of the ellipsoidal concave mirror 222. The second focal point of the ellipsoidal concave mirror 222 is located in the plasma generating region 25.

2.1.5 Target Sensor

The target sensor 80 is used together with the illumination unit 85 in FIG. 3A. The target sensor 80 and the illumination unit 85 are arranged on substantially opposite sides with the plasma generating region 25 therebetween.

The illumination unit 85 is arranged in a predetermined position away from the plasma generating region 25 substantially in the −X direction. For example, the illumination unit 85 is located outside the chamber 2a. A window 88 is located in a wall surface of the chamber 2a between the plasma generating region 25 and the illumination unit 85.

The illumination unit 85 includes a flash lamp 85a and an illumination optical system 85b. The flash lamp 85a and the illumination optical system 85b are arranged in a casing 86 in this order. The measurement control unit 51 controls lighting timing of the flash lamp 85a. The flash lamp 85a is configured to illuminate, through the illumination optical system 85b and the window 88, the droplet 27a having reached the plasma generating region 25 or therearound.

The target sensor 80 is arranged in a predetermined position away from the plasma generating region 25 substantially in the +X direction. For example, the target sensor 80 is located outside the chamber 2a. A window 83 is located in a wall surface of the chamber 2a between the plasma generating region 25 and the target sensor 80.

The target sensor 80 includes an imaging optical system 80a, a high-speed shutter 80b, a transfer optical system 80c, and an image sensor 80d. The imaging optical system 80a, the high-speed shutter 80b, the transfer optical system 80c, and the image sensor 80d are arranged in the casing 81 in this order.

The imaging optical system 80a is arranged so that an image of the droplet 27a having reached the plasma generating region 25 or therearound is formed on a first surface of the high-speed shutter 80b.

The high-speed shutter 80b is constituted by an image intensifier in which, for example, a photoelectric surface, a multichannel plate, and a fluorescent surface are arranged in this order although not shown in detail. The photoelectric surface corresponds to the first surface and generates electrons from light energy. The multichannel plate intensifies the electrons when a voltage is applied to the multichannel plate. The fluorescent surface generates light from energy of the electrons. The voltage applied to the multichannel plate is switchable at high speed. Thus, an image at a desired moment among images formed on the photoelectric surface is selected and output on the fluorescent surface that is a second surface of the high-speed shutter 80b. The high-speed shutter 80b is controlled by the measurement control unit 51.

The transfer optical system 80c is arranged to transfer the image output on the second surface of the high-speed shutter 80b further to a light receiving surface of the image sensor 80d.

The image sensor 80d generates picture image data corresponding to the image transferred to the light receiving surface. The target sensor 80 outputs, to the measurement control unit 51, the picture image data of the droplet 27a captured by the image sensor 80d. The target sensor 80 corresponds to an image capturing unit in the present disclosure. The image sensor 80d corresponds to an imaging element in the present disclosure.

2.2 Operation 2.2.1 Output of Droplet 27a

The target control unit 52 outputs a control signal to the target supply unit 26. A target substance held in the target supply unit 26 is maintained at a temperature equal to or higher than a melting point of the target substance by a heater (not shown). The target substance in the target supply unit 26 is pressurized by an inert gas supplied into the target supply unit 26.

The target substance pressurized by the inert gas is output as a jet through the opening. The vibrating device vibrates at least components of the target supply unit 26 around the opening, thereby separating the jet of the target substance into a plurality of droplets 27a. The droplets 27a move in a −Y direction from the target supply unit 26 toward the plasma generating region 25.

The target recovery unit 28 recovers the droplets 27a having passed through the plasma generating region 25.

2.2.2 Output of Pulse Laser Beam

The EUV light generation control unit 5 outputs a first trigger signal to the pre-pulse laser 3p. The pre-pulse laser 3p outputs the pre-pulse laser beam 31p according to the first trigger signal. The EUV light generation control unit 5 outputs the first trigger signal and then outputs a second trigger signal to the main pulse laser 3m. The main pulse laser 3m outputs the main pulse laser beam 31m according to the second trigger signal. As such, the laser apparatus 3 outputs the pre-pulse laser beam 31p and the main pulse laser beam 31m in this order. The pre-pulse laser beam 31p preferably has a pulse time width of picosecond order. The picosecond order refers to 1 ps or more and less than 1 ns.

2.2.3 Transmission of Pulse Laser Beam

The pre-pulse laser beam 31p and the main pulse laser beam 31m enter the laser beam traveling direction control unit 34a.

In the laser beam traveling direction control unit 34a, a sensor (not shown) detects the pre-pulse laser beam 31p and the main pulse laser beam 31m and outputs a detection result to the EUV light generation control unit 5. The EUV light generation control unit 5 calculates beam positions and beam pointings of the pre-pulse laser beam 31p and the main pulse laser beam 31m based on the output of the sensor. The EUV light generation control unit 5 controls the actuators (not shown) of the holders 350, 404, 347, 348 based on the beam positions and the beam pointings.

2.2.4 Focusing of Pulse Laser Beam

The pre-pulse laser beam 31p and the main pulse laser beam 31m are guided through the laser beam traveling direction control unit 34a into the laser beam focusing optical system 22a as the pulse laser beam 32.

The pulse laser beam 32 is reflected by the off-axis parabolic convex mirror 221 included in the laser beam focusing optical system 22a, and thus its beam width is expanded. The pulse laser beam 32 reflected by the off-axis parabolic convex mirror 221 is reflected by the ellipsoidal concave mirror 222 and focused on the plasma generating region 25 as a pulse laser beam 33. The pulse laser beam 33 includes the pre-pulse laser beam 31p and the main pulse laser beam 31m.

The laser beam focusing optical system actuator 44 adjusts a position of the plate 43 relative to the plate 42. The laser beam focusing optical system actuator 44 is controlled by a control signal output from the EUV light generation control unit 5. The position of the plate 43 is adjusted to adjust positions of the off-axis parabolic convex mirror 221 and the ellipsoidal concave mirror 222. Moving the off-axis parabolic convex mirror 221 and the ellipsoidal concave mirror 222 varies the optical path axes of the pre-pulse laser beam 31p and the main pulse laser beam 31m included in the pulse laser beam 33. As described above, the second focal point of the ellipsoidal concave mirror 222 substantially matches a focal point of the pulse laser beam 33. Thus, a moving direction and a moving distance of the plate 43 by the laser beam focusing optical system actuator 44 substantially match a moving direction and a moving distance of the focal point of the pulse laser beam 33, respectively.

At timing when one droplet 27a reaches the plasma generating region 25, the droplet 27a is irradiated with the pre-pulse laser beam 31p. The droplet 27a irradiated with the pre-pulse laser beam 31p is expanded or diffused into a secondary target. The secondary target contains mist of the target substance. At timing when the secondary target is expanded or diffused into a desired size, the secondary target is irradiated with the main pulse laser beam 31m. The secondary target irradiated with the main pulse laser beam 31m is turned into plasma, and radiation light 251 including EUV light is radiated from the plasma.

2.2.5 Detection of Target Position

In the illumination unit 85, the flash lamp 85a emits visible light based on the control signal from the measurement control unit 51. The light emitted from the flash lamp 85a passes through the illumination optical system 85b and the window 88 and reaches the plasma generating region 25 and therearound.

In the target sensor 80, the imaging optical system 80a forms, on the first surface of the high-speed shutter 80b, an image of an object existing in the plasma generating region 25 or therearound. The high-speed shutter 80b outputs, on the second surface, an image formed at a desired moment among images formed on the first surface. The transfer optical system 80c transfers the image output on the second surface of the high-speed shutter 80b further to the light receiving surface of the image sensor 80d. The image sensor 80d outputs, to the measurement control unit 51, picture image data representing light intensity distribution of the image transferred to the light receiving surface.

The target sensor 80 can capture an image of the droplet 27a before the droplet 27a having reached the plasma generating region 25 or therearound is irradiated with the pre-pulse laser beam 31p. The measurement control unit 51 calculates a parameter of the droplet 27a based on the picture image data obtained from the target sensor 80. The parameter of the droplet 27a includes a position of the droplet 27a at a predetermined timing.

The measurement control unit 51 transmits the calculated parameter of the droplet 27a to the target control unit 52. The target control unit 52 controls the target supply unit actuator 261 based on the parameter of the droplet 27a. Controlling the target supply unit actuator 261 can change the trajectory of the droplet 27a. Changing the trajectory of the droplet 27a can change, in the +Z direction, the −Z direction, the +X direction, and the −X direction, the position of the droplet 27a at timing when the pre-pulse laser beam 31p reaches the plasma generating region 25.

The EUV light generation control unit 5 controls timing of the first trigger signal output to the pre-pulse laser 3p based on the parameter of the droplet 27a. Controlling the timing of the first trigger signal can change, in the +Y direction and the −Y direction, the position of the droplet 27a at the timing when the pre-pulse laser beam 31p reaches the plasma generating region 25.

The position of the droplet 27a at the timing when the pre-pulse laser beam 31p reaches the plasma generating region 25 is set, for example, according to a change instruction output from the exposure apparatus control unit 60 included in the exposure apparatus 6.

2.3 Problem

Figure 3B:
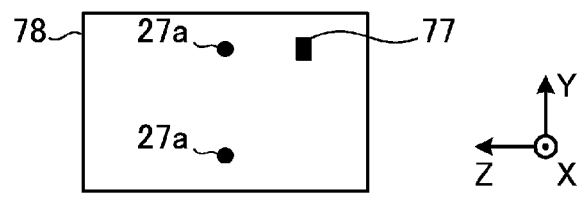
FIG. 3B shows an example of a picture image captured by the target sensor 80 in the comparative example.

FIG. 3B shows an example of a picture image captured by the target sensor 80 in the comparative example. An area 78 of the picture image captured by the target sensor 80 includes an image/images of one or more droplets 27a. A position of the image of at least one droplet 27a included in the picture image corresponds to the position of the droplet 27a at the predetermined timing.

The area 78 of the picture image captured by the target sensor 80 may include a measurement impossible region 77. The measurement impossible region 77 is created due to, for example, an uneven amount of light output from the illumination unit 85, dust adhering to the optical systems included in the target sensor 80, pixel loss of the image sensor 80d, variations in sensitivity of the image sensor 80d on the light receiving surface, or the like. In such a measurement impossible region 77, the droplet 27a cannot be detected or a clear image of the droplet 27a cannot be detected.

The position of the image of the droplet 27a overlapping the measurement impossible region 77 may provide an inaccurate measurement result. The inaccurate measurement result may cause a deviation between the position of the droplet 27a and the optical path of the pulse laser beam 33, thereby generating EUV light with unstable energy.

In the embodiments described below, the measurement impossible region 77 of the target sensor 80 is previously specified. If the position of the image of the droplet 27a overlaps the measurement impossible region 77, at least a part of the target sensor 80 is moved. Moving at least the part of the target sensor 80 can move the area 78 of the picture image relative to the image of the droplet 27a. This can move the position of the image of the droplet 27a away from the measurement impossible region 77, thereby preventing a reduction in clarity of the image of the droplet 27a.

The process of moving at least the part of the target sensor 80 is performed, for example, when set information on the position of the droplet 27a at a predetermined timing is changed according to the change instruction output from the exposure apparatus control unit 60.

Further, in the embodiments below, information on a coordinate system in the picture image captured by the target sensor 80 is updated according to an amount of movement of at least the part of the target sensor 80. The information on the coordinate system includes information on an origin. Updating the information on the coordinate system can calibrate a deviation of a measurement result due to movement of at least the part of the target sensor 80.

3. EUV LIGHT GENERATION SYSTEM CONFIGURED TO MOVE TARGET SENSOR 80

3.1 Configuration

Figure 4:
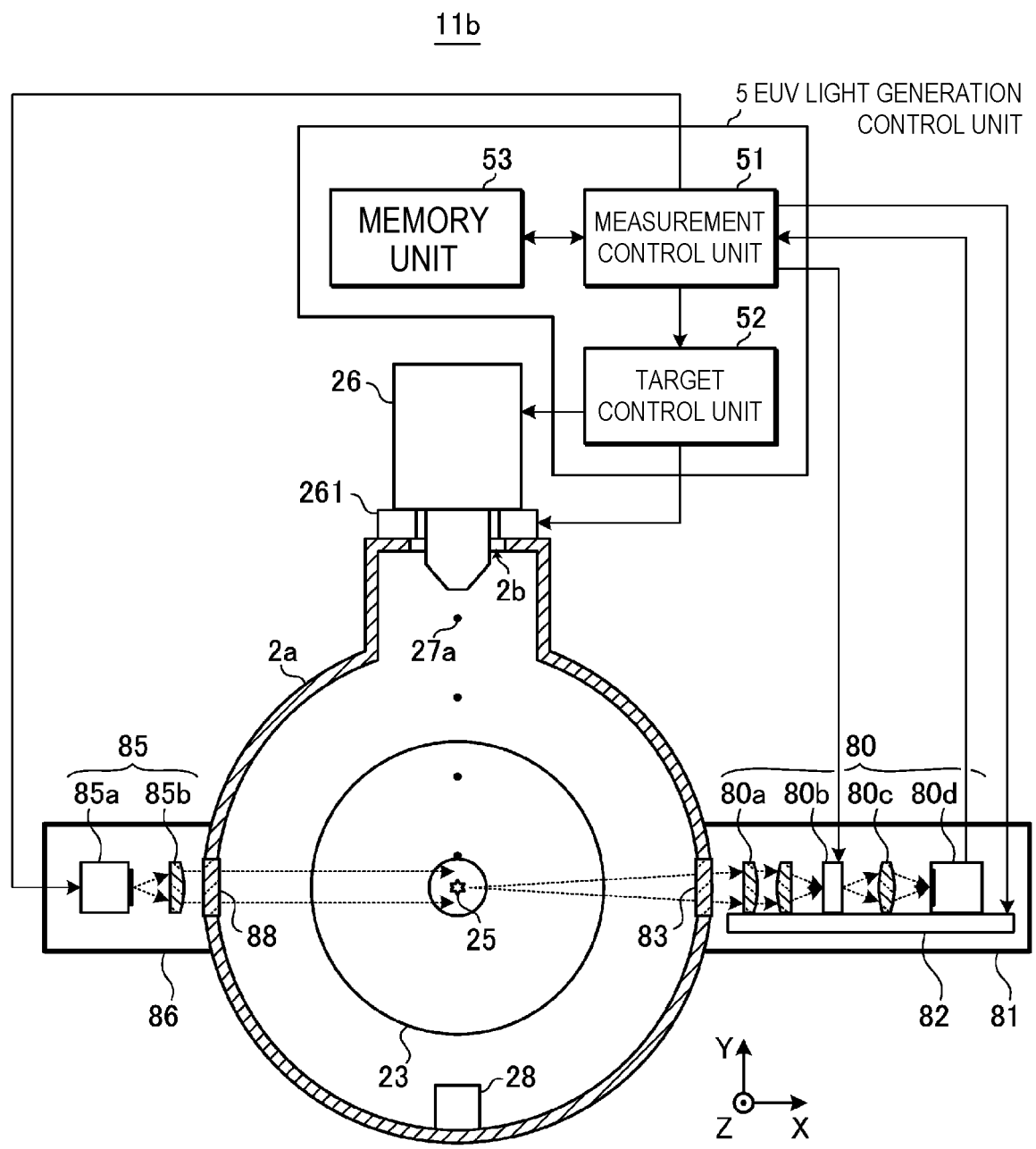
FIG. 4 is a partial sectional view of a configuration of an EUV light generation system 11b according to a first embodiment of the present disclosure.

FIG. 4 is a partial sectional view of a configuration of an EUV light generation system 11b according to a first embodiment of the present disclosure. In the first embodiment, a target sensor 80 is movably supported in a casing 81 by a stage 82. The stage 82 is controlled by a measurement control unit 51. The stage 82 is configured to move at least a part of the target sensor 80 in a +Y direction, a −Y direction, a +Z direction, and a −Z direction. The stage 82 corresponds to a moving unit in the present disclosure.

In the first embodiment, the EUV light generation control unit 5 further includes a memory unit 53. The memory unit 53 is configured to store information specifying a measurement impossible region in a picture image captured by the target sensor 80. The memory unit 53 further stores a movable range in which an area of the picture image captured by the target sensor 80 is movable by moving the target sensor 80.

A target measuring apparatus in the present disclosure includes the target sensor 80, the stage 82, and the measurement control unit 51. The target measuring apparatus in the present disclosure further includes the memory unit 53.

Other points are similar to those in the comparative example.

3.2 Operation 3.2.1 Main Flow

Figure 5:
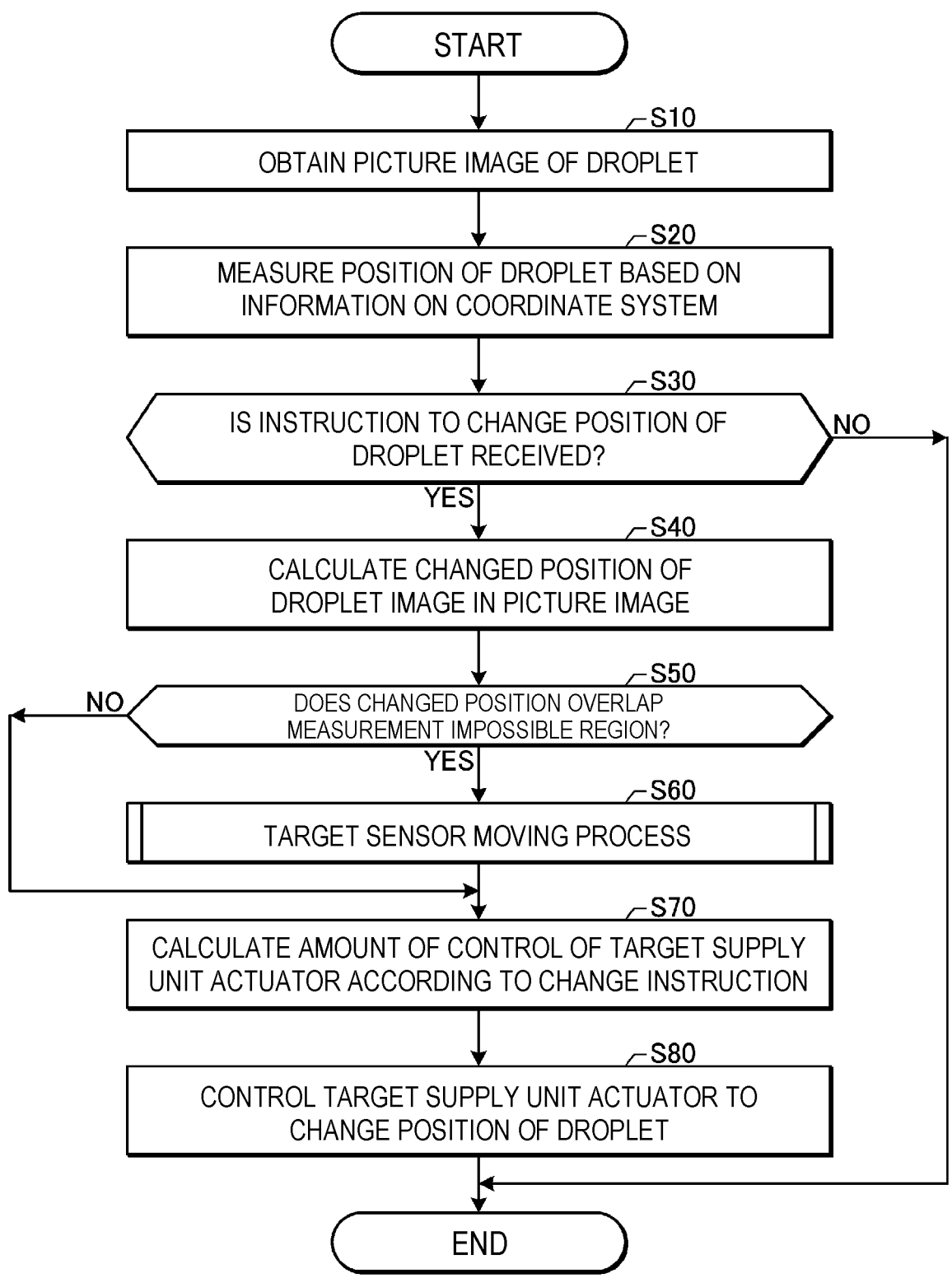
FIG. 5 is a flowchart of a procedure of an EUV light generation control unit 5 in the first embodiment.

FIG. 5 is a flowchart of a procedure of an EUV light generation control unit 5 in the first embodiment. By processes described below, the EUV light generation control unit 5 moves the target sensor 80 so that a position of an image of a droplet 27a is moved away from the measurement impossible region of the target sensor 80. Further, the EUV light generation control unit 5 updates information on a coordinate system in the picture image captured by the target sensor 80 according to an amount of movement of the target sensor 80.

Prior to the processes described below, the EUV light generation control unit 5 holds the information on the coordinate system in the picture image captured by the target sensor 80. The information on the coordinate system includes information on an origin. Processes from S10 to S60 are performed by the measurement control unit 51 included in the EUV light generation control unit 5. Processes in S70 and S80 are performed by a target control unit 52 included in the EUV light generation control unit 5.

First, in S10, the measurement control unit 51 included in the EUV light generation control unit 5 controls a high-speed shutter 80b, and obtains a picture image of a droplet 27a from an image sensor 80d.

Then, in S20, the measurement control unit 51 specifies the droplet 27a in the picture image captured in S10. Further, the measurement control unit 51 measures a parameter of the droplet 27a based on the picture image and the information on the coordinate system. The parameter of the droplet 27a includes information on a position of the droplet 27a at a predetermined timing.

Next, in S30, the measurement control unit 51 determines whether or not an instruction to change the position of the droplet 27a is received from an exposure apparatus control unit 60. The instruction to change the position of the droplet 27a is, for example, a signal to change set information on the position of the droplet 27a at the predetermined timing. If the instruction to change the position of the droplet 27a is received (YES in S30), the measurement control unit 51 goes to the process in S40. If the instruction to change the position of the droplet 27a is not received (NO in S30), the EUV light generation control unit 5 finishes the processes in this flowchart. The EUV light generation control unit 5 repeats the processes in this flowchart at predetermined time intervals.

In S40, the measurement control unit 51 calculates information specifying a changed position of the image of the droplet 27a in the picture image captured in S10. The changed position is calculated based on the instruction to change the position of the droplet 27a received from the exposure apparatus control unit 60.

Next, in S50, the measurement control unit 51 reads the information specifying the measurement impossible region stored in the memory unit 53. Further, the measurement control unit 51 determines whether or not the changed position calculated in S40 overlaps the measurement impossible region. The case where the changed position calculated in S40 overlaps the measurement impossible region is not limited to the case where the changed position is located inside an outer edge of the measurement impossible region. For example, the measurement control unit 51 may determine that the changed position overlaps the measurement impossible region when a distance between the changed position and the outer edge of the measurement impossible region is within a predetermined value. The predetermined value may be 0 or more. The predetermined value may be, for example, a value corresponding to a length of approximately ten times a diameter of the droplet 27a. When the diameter of the droplet 27a is 20 μm, the predetermined value may be 200 μm.

If the changed position calculated in S40 overlaps the measurement impossible region (YES in S50), the measurement control unit 51 goes to the process in S60.

If the changed position calculated in S40 does not overlap the measurement impossible region (NO in S50), the processes with the measurement control unit 51 are finished, and the EUV light generation control unit 5 skips S60 and goes to the process in S70.

In S60, the measurement control unit 51 performs a process of moving the target sensor 80. For example, the measurement control unit 51 moves at least the part of the target sensor 80 so that the distance between the changed position calculated in S40 and the outer edge of the measurement impossible region becomes larger than the predetermined value. This process will be described in detail with reference to FIG. 6. After S60, the processes with the measurement control unit 51 are finished, and the EUV light generation control unit 5 goes to the process in S70.

In S70, the target control unit 52 included in the EUV light generation control unit 5 calculates an amount of control of a target supply unit actuator 261 according to the instruction to change the position of the droplet 27a.

Next, in S80, the target control unit 52 controls the target supply unit actuator 261. Controlling the target supply unit actuator 261 can change the position of the droplet 27a at the predetermined timing in the +Z direction, the −Z direction, the +X direction, or the −X direction. When the instruction to change the position of the droplet 27a includes an instruction to change the position of the droplet 27a in the +Y direction or the −Y direction, the EUV light generation control unit 5 may control timing of a first trigger signal output to a pre-pulse laser 3p.

After S80, the EUV light generation control unit 5 finishes the processes in this flowchart.

3.2.2 Process of Moving Target Sensor 80

Figure 6:
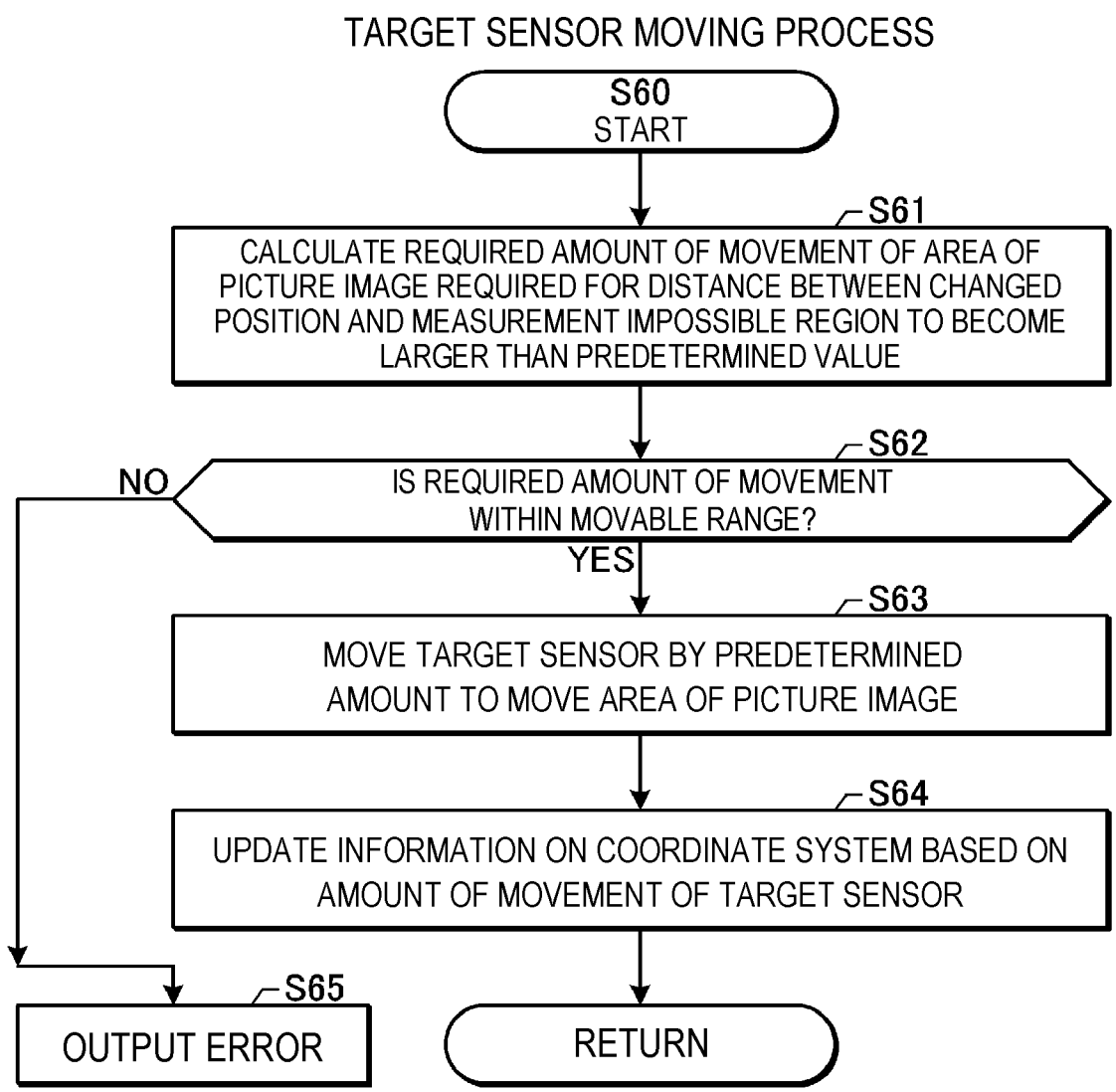
FIG. 6 is a flowchart of a detailed process of moving a target sensor 80 in the first embodiment.

FIG. 6 is a flowchart of a detailed process of moving the target sensor 80 in the first embodiment. The process in FIG. 6 is performed by the measurement control unit 51 included in the EUV light generation control unit 5 as a subroutine of S60 in FIG. 5.

First, in S61, the measurement control unit 51 calculates a required amount of movement of an area of a picture image required for the distance between the changed position calculated in S40 and the outer edge of the measurement impossible region to become larger than the predetermined value. The required amount of movement will be described with reference to FIGS. 8 and 9.

Next, in S62, the measurement control unit 51 determines whether or not the required amount of movement calculated in S61 is within the movable range of the area of the picture image. The movable range of the area of the picture image is stored in the memory unit 53. The movable range of the area of the picture image will be described with reference to FIGS. 8 and 9.

If the required amount of movement is not within the movable range of the area of the picture image (NO in S62), the measurement control unit 51 goes to a process in S65. In S65, the measurement control unit 51 outputs an error signal, and stops the processes in FIGS. 5 and 6. An operator may stop an operation of the EUV light generation system 11*b* and replace the target sensor 80.

If the required amount of movement is within the movable range of the area of the picture image (YES in S62), the measurement control unit 51 goes to a process in S63. In S63, the measurement control unit 51 controls the stage 82 to move at least the part of the target sensor 80 by a predetermined amount. Specifically, the measurement control unit 51 controls the stage 82 so that the distance between the changed position calculated in S40 and the outer edge of the measurement impossible region becomes larger than the predetermined value. The process of moving at least the part of the target sensor 80 by the predetermined amount corresponds to a third process in the present disclosure. Moving at least the part of the target sensor 80 moves the area of the picture image captured by the target sensor 80. An amount of control of the stage 82 may be adjusted so that an amount of movement of the area of the picture image substantially matches the required amount of movement calculated in S61.

Next, in S64, the measurement control unit 51 updates the information on the coordinate system in the picture image captured by the target sensor 80 based on the amount of movement of at least the part of the target sensor 80. The amount of movement of at least the part of the target sensor 80 determines the amount of movement of the area of the picture image, and thus the measurement control unit 51 updates the information on the coordinate system according to the amount of movement of the area of the picture image. The information on the coordinate system includes information on the origin. The process of updating the information on the coordinate system corresponds to a first process in the present disclosure.

After S64, the measurement control unit 51 finishes the processes in this flowchart, and returns to the processes in FIG. 5. The EUV light generation control unit 5 repeats the processes in FIG. 5 at predetermined time intervals. When the process in S20 in FIG. 5 is performed after the information on the coordinate system is updated to new information in S64, the measurement control unit 51 measures a position of the droplet 27*a* based on a new picture image and new information on the coordinate system. The process of measuring the position or other parameters of the droplet 27*a* based on the picture image and the information on the coordinate system corresponds to a second process in the present disclosure.

Here, the case where the process of updating the information on the coordinate system in S64 is performed after the process of moving the target sensor 80 in S63 has been described, but the present disclosure is not limited to this. The amount of movement of the target sensor 80 may be previously calculated, and the process of moving the target sensor 80 in S63 may be performed after the process of updating the information on the coordinate system in S64.

Also, in FIGS. 5 and 6, the example in which the process of moving the target sensor 80 is performed and the information on the coordinate system is updated only when the instruction to change the position of the droplet 27*a* is received, but the present disclosure is not limited to this. Even without the instruction to change the position of the droplet 27*a* being received, for example, if degradation of the target sensor 80 expands the measurement impossible region, the process of moving the target sensor 80 may be performed and the information on the coordinate system may be updated.

FIGS. 7A to 7E show examples of picture images in the processes in FIGS. 5 and 6.

Figure 7A:
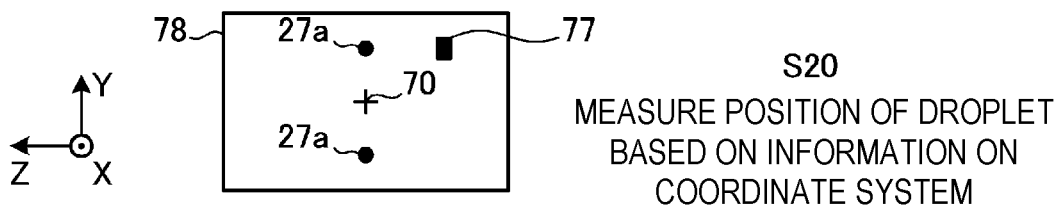
FIGS. 7A to 7E show examples of picture images in the processes in FIGS. 5 and 6.

FIG. 7A shows measuring the position of the droplet 27*a* in S20 in the picture image captured in S10 shown in FIG. 5. If the area 78 of the picture image captured by the target sensor 80 includes an image of at least one droplet 27*a*, the measurement control unit 51 can calculate the position of the droplet 27*a* at the predetermined timing. The position of the droplet 27*a* at the predetermined timing can be calculated based on a positional relationship between the image of the droplet 27*a* included in the picture image and an origin 70 of the picture image.

If the area 78 of the picture image captured by the target sensor 80 includes images of two or more droplets 27*a*, the measurement control unit 51 can calculate a distance between one droplet 27*a* and a next one droplet 27*a*. Separately obtaining a time difference between one droplet 27*a* and the next one droplet 27*a* allows calculation of speed of the droplets 27*a* from the distance.

Figure 7B:
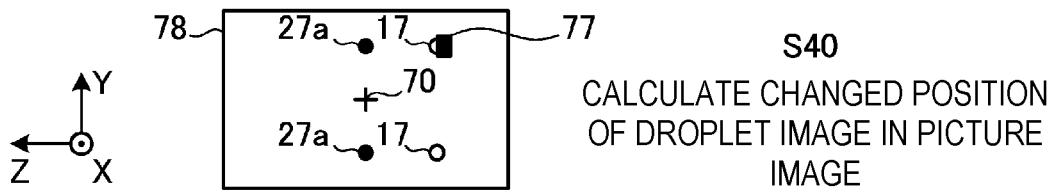

FIG. 7B shows calculating a changed position 17 in S40 based on the instruction to change the position of the droplet 27*a* received in S30 in FIG. 5. When the change instruction indicates moving the position of the droplet 27*a*, for example, in the −Z direction by a predetermined amount, the measurement control unit 51 calculates the changed position 17 on the right side in FIG. 7B with respect to the position of the image of the droplet 27*a*.

The picture image captured by the target sensor 80 may include a measurement impossible region 77. In S50, the measurement control unit 51 determines whether or not the changed position 17 overlaps the measurement impossible region 77. If the changed position 17 overlaps the measurement impossible region 77, the measurement control unit 51 moves at least the part of the target sensor 80 in S60 in FIG. 5.

Figure 7C:
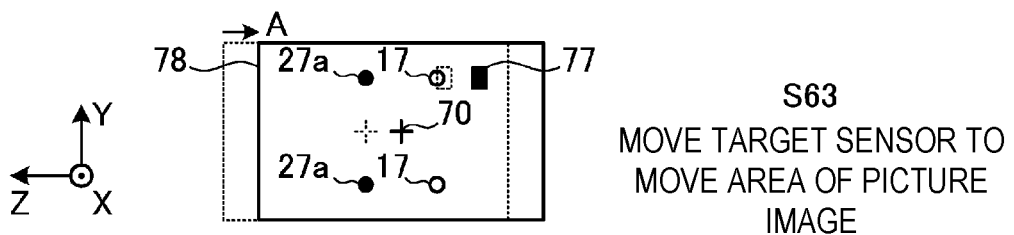

FIG. 7C shows at least the part of the target sensor 80 having been moved in S60 in FIG. 5, in particular, S63 in FIG. 6. Moving at least the part of the target sensor 80 moves the area 78 of the picture image captured by the target sensor 80. If the area 78 of the picture image moves, for example, in an arrow A direction, the origin 70 and the measurement impossible region 77 also move in the arrow A direction. The positions thereof before being moved are shown by dashed lines in FIG. 7C. Amounts of movement thereof substantially correspond to the amount of movement of the target sensor 80.

On the other hand, even if the area 78 of the picture image moves together with the origin 70 and the measurement impossible region 77, an absolute position of the droplet 27*a* and an absolute position of the droplet 27*a* having been changed according to the instruction from the exposure apparatus control unit 60 do not move. Thus, the measurement impossible region 77 moves relative to the position of the image of the droplet 27*a* included in the picture image and the changed position 17. This can move the measurement impossible region 77 away from the changed position 17 as shown in FIG. 7C.

However, movement of the area 78 of the picture image changes a positional relationship of the position of the image of the droplet 27a and the changed position 17 to the position of the origin 70. Then, the measurement control unit 51 updates the information on the origin 70 in S64.

Figure 7D:
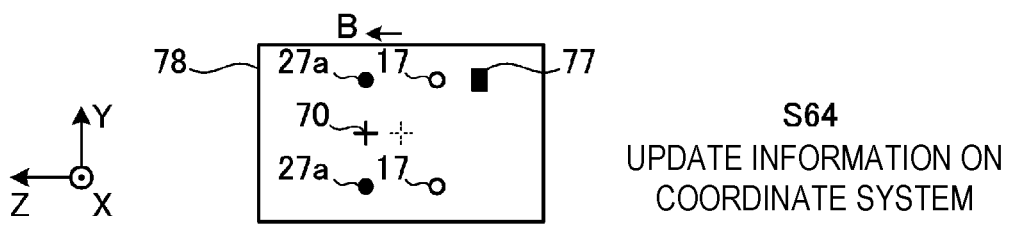

FIG. 7D shows updating the information on the origin 70 in S60 in FIG. 5, in particular, S64 in FIG. 6. If the area 78 of the picture image is moved, for example, in the arrow A direction in FIG. 7C, the origin 70 is moved in an arrow B direction opposite to the arrow A direction in FIG. 7D. The position of the origin 70 before being moved is shown by a dashed line in FIG. 7D. An absolute value of an amount of movement of the origin 70 in FIG. 7D may be the same as an absolute value of an amount of movement of the area 78 of the picture image in FIG. 7C. As such, updating the information on the origin 70 allows the measurement control unit 51 to accurately detect the position of the droplet 27a.

Figure 7E:
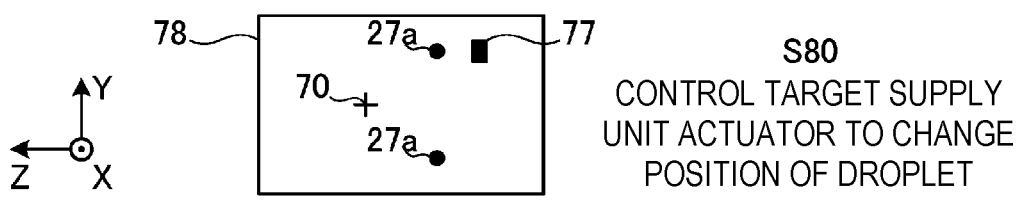

FIG. 7E shows controlling the target supply unit actuator 261 to change the position of the droplet 27a in S80 in FIG. 5. The position of the image of the droplet 27a in FIG. 7E corresponds to the position of the changed position 17 in FIG. 7D. The position of the image of the droplet 27a in FIG. 7E is away from the measurement impossible region 77 by a predetermined amount or more.

3.3 Effect

According to the first embodiment, moving at least the part of the target sensor 80 can move the position of the image of the droplet 27a away from the measurement impossible region 77, thereby preventing a reduction in clarity of the image of the droplet 27a. Also, according to the first embodiment, updating the information on the coordinate system in the picture image according to the movement of the target sensor 80 allows accurate detection of the position of the droplet 27a.

4. EUV LIGHT GENERATION SYSTEM CONFIGURED TO DETERMINE MOVING DIRECTION OF TARGET SENSOR 80

Figure 8A:
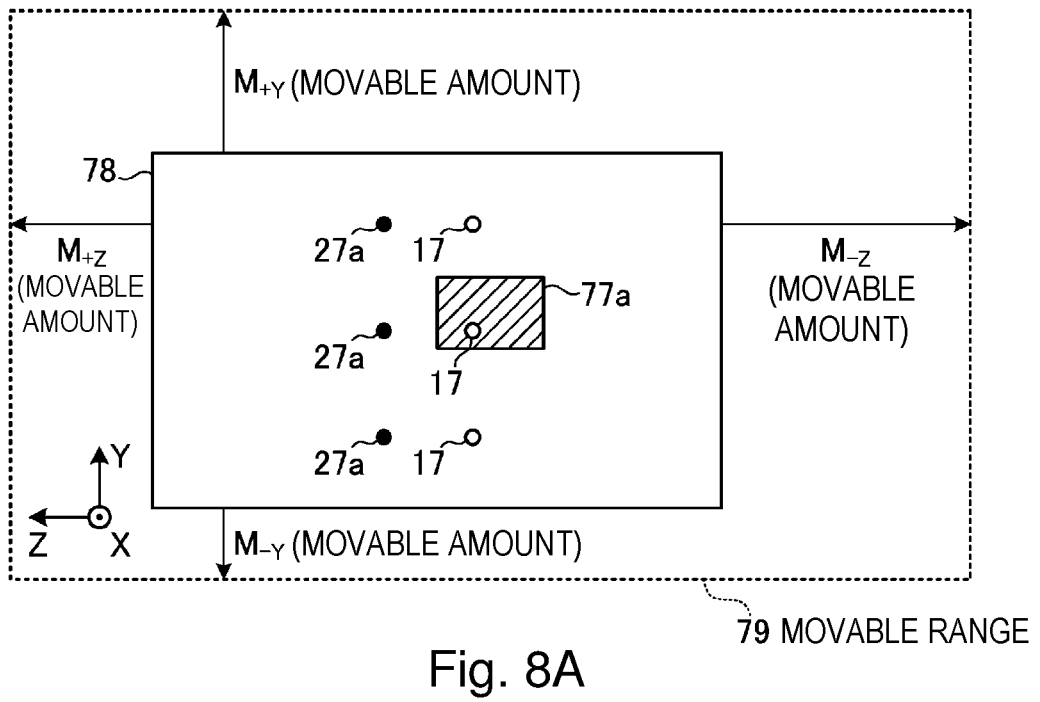
FIGS. 8A and 8B show examples of picture images in a second embodiment of the present disclosure.
Figure 8B:
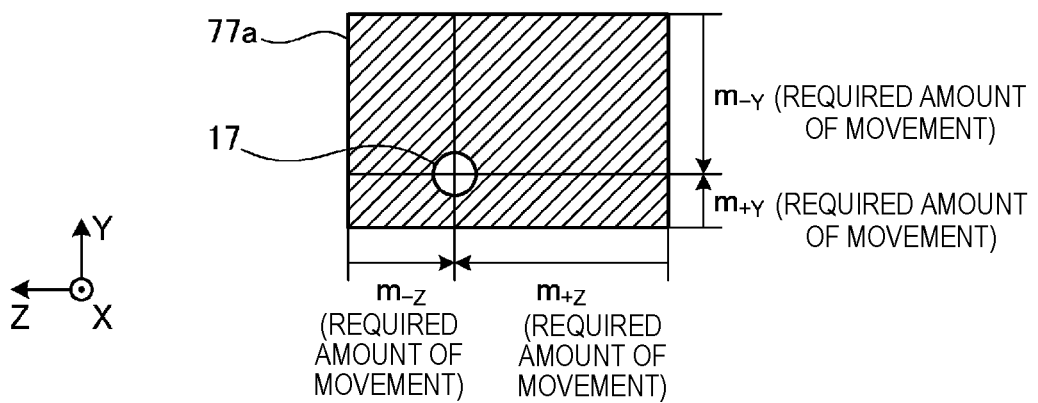

FIGS. 8A and 8B show examples of picture images in a second embodiment of the present disclosure. A configuration of an EUV light generation system according to the second embodiment is similar to that described with reference to FIG. 4. The EUV light generation system according to the second embodiment is different from the first embodiment in that a moving direction is determined based on a required amount of movement and a movable amount in a process of moving at least a part of a target sensor 80 in S60 in FIG. 5.

FIG. 8A shows a state in which an area 78 of a picture image captured by the target sensor 80 includes a measurement impossible region 77a, and a changed position 17 overlaps the measurement impossible region 77a. Here, a stage 82 can be used to move at least the part of the target sensor 80 to move the area 78 of the picture image in a movable range 79 shown by a dashed line in FIG. 8A. The measurement control unit 51 can calculate a movable amount of the area 78 of the picture image based on the current position of the target sensor 80 and information on the movable range 79.

In the movable range 79, a movable amount for moving the area 78 of the picture image in a -Y direction from the current position is $M_{-Y}$.

In the movable range 79, a movable amount for moving the area 78 of the picture image in a +Y direction from the current position is $M_{+Y}$.

In the movable range 79, a movable amount for moving the area 78 of the picture image in a -Z direction from the current position is $M_{-Z}$.

In the movable range 79, a movable amount for moving the area 78 of the picture image in a +Z direction from the current position is $M_{+Z}$.

FIG. 8B shows, in an enlarged manner, the measurement impossible region 77a in FIG. 8A. The changed position 17 is surrounded by an outer edge of the measurement impossible region 77a. In the description of the second embodiment, an amount of movement of the area 78 of the picture image required for preventing the changed position 17 from overlapping the measurement impossible region 77a is referred to as a required amount of movement. Alternatively, an amount of movement of the area 78 of the picture image required for a distance between the changed position 17 and the measurement impossible region 77a to be larger than the predetermined value is referred to as a required amount of movement. The measurement control unit 51 can calculate the required amount of movement based on information specifying the changed position 17, and information specifying a position and an area of the measurement impossible region 77a.

A required amount of movement for moving the area 78 of the picture image in the -Y direction from the current position is $m_{-Y}$.

A required amount of movement for moving the area 78 of the picture image in the +Y direction from the current position is $m_{+Y}$.

A required amount of movement for moving the area 78 of the picture image in the -Z direction from the current position is $m_{-Z}$.

A required amount of movement for moving the area 78 of the picture image in the +Z direction from the current position is $m_{+Z}$.

The calculation of the required amount of movement with reference to a center position of the changed position 17 without considering a size of the droplet 27a is shown, but the present disclosure is not limited to this. The required amount of movement may be calculated so that the changed position 17 does not overlap the measurement impossible region 77a considering the size of the droplet 27a. Alternatively, the required amount of movement may be calculated so that the distance between the changed position 17 and the measurement impossible region 77a becomes larger than the predetermined value considering the size of the droplet 27a.

The measurement control unit 51 calculates differences $D_{-Y}$, $D_{+Y}$, $D_{-Z}$, $D_{+Z}$ between the movable amounts and the required amounts of movement in the -Y direction, +Y direction, -Z direction, and +Z direction. The differences between the movable amounts and the required amounts of movement are given by the following expressions:

$$D_{-Y}=M_{-Y}-m_{-Y}$$

$$D_{+Y}=M_{+Y}-m_{+Y}$$

$$D_{-Z}=M_{-Z}-m_{-Z}$$

$$D_{+Z}=M_{+Z}-m_{+Z}$$

The measurement control unit 51 selects, as a moving direction of the area 78 of the picture image, a moving direction with the largest difference among the differences $D_{-Y}$, $D_{+Y}$, $D_{-Z}$, $D_{+Z}$ between the movable amounts and the required amounts of movement.

Processes with the EUV light generation control unit 5 in the second embodiment are similar to those described with reference to FIGS. 5 and 6.

However, in S61 in FIG. 6, the measurement control unit 51 calculates the required amounts of movement in the −Y direction, the +Y direction, the −Z direction, and the +Z direction.

In S62 in FIG. 6, the measurement control unit 51 determines "YES" if any one or more of the differences $D_{-Y}$, $D_{+Y}$, $D_{-Z}$, $D_{+Z}$ is a positive number, and determines "NO" if none of the differences $D_{-Y}$, $D_{+Y}$, $D_{-Z}$, $D_{+Z}$ is a positive number.

When the measurement control unit 51 determines "YES" in S62 in FIG. 6, the measurement control unit 51 selects the moving direction by the method described above, and moves at least the part of the target sensor 80 in S63.

According to the second embodiment, the moving direction can be determined so as to reduce variations in the movable amounts $M_{-Y}$, $M_{+Y}$, $M_{-Z}$, $M_{+Z}$ calculated again after at least the part of the target sensor 80 is moved.

Figure 9A:
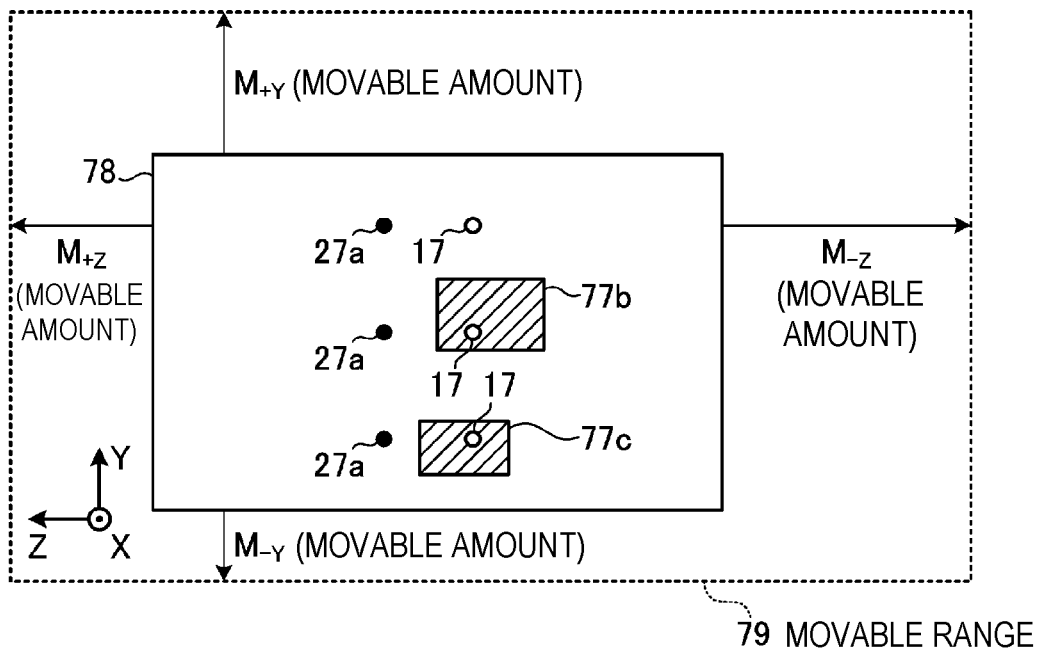
FIGS. 9A to 9C show examples of picture images in a variant of the second embodiment.
Figure 9B:
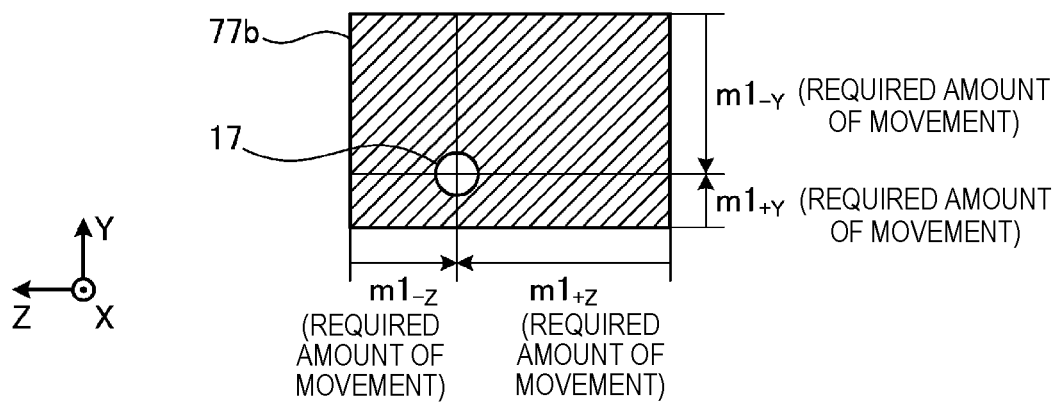
Figure 9C:
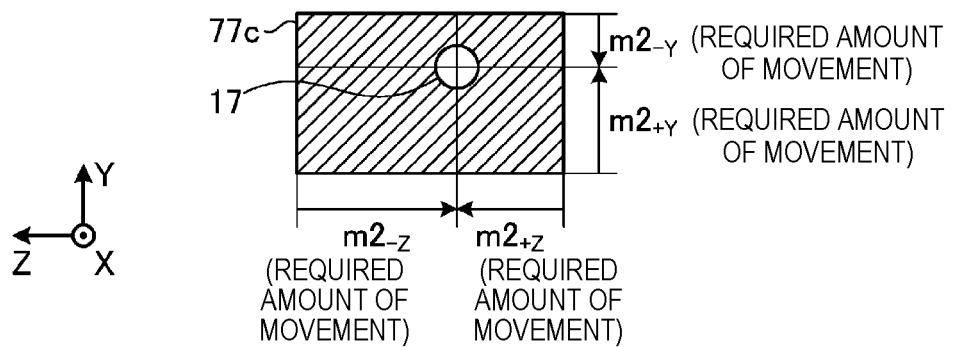

FIGS. 9A to 9C show examples of picture images in a variant of the second embodiment. In this variant, changed positions 17 of images of a plurality of droplets 27a overlap measurement impossible regions 77b, 77c.

FIG. 9B shows, in an enlarged manner, the measurement impossible region 77b in FIG. 9A. Similarly to the description with reference to FIG. 8B, required amounts of movement for preventing the changed position 17 from overlapping the measurement impossible region 77b are denoted by $m1_{-Y}$, $m1_{+Y}$, $m1_{-Z}$, and $m1_{+Z}$ as shown.

FIG. 9C shows, in an enlarged manner, the measurement impossible region 77c in FIG. 9A. Similarly to the description with reference to FIG. 8B, required amounts of movement for preventing the changed position 17 from overlapping the measurement impossible region 77c are denoted by $m2_{-Y}$, $m2_{+Y}$, $m2_{-Z}$, and $m2_{+Z}$ as shown.

Required amounts of movement $m_{-Y}$, $m_{+Y}$, $m_{-Z}$, and $m_{+Z}$ for preventing the changed positions 17 of the images of the droplets 27a from overlapping either of the measurement impossible regions 77b, 77c are expressed as described below:

$$m_{-Y} = \text{MAX}(m1_{-Y}, m2_{-Y})$$

$$m_{+Y} = \text{MAX}(m1_{+Y}, m2_{+Y})$$

$$m_{-Z} = \text{MAX}(m1_{-Z}, m2_{-Z})$$

$$m_{+Z} = \text{MAX}(m1_{+Z}, m2_{+Z})$$

where MAX(a, b) denotes a maximum value among a plurality of values a, b.

Other points are similar to those described with reference to FIGS. 8A and 8B. Specifically, the measurement control unit 51 uses the required amounts of movement $m_{-Y}$, $m_{+Y}$, $m_{-Z}$, and $m_{+Z}$ calculated as described above to calculate differences $D_{-Y}$, $D_{+Y}$, $D_{-Z}$, $D_{+Z}$ between the movable amounts and the required amounts of movement and select a moving direction.

According to the variant described above, even if the changed positions 17 of the images of the droplets 27a overlap the measurement impossible regions, the moving direction can be properly selected.

In the second embodiment and its variant, determining the moving direction considering both the movable amount and the required amount of movement has been described, but the present disclosure is not limited to this. If the required amount of movement is sufficiently smaller than the movable amount, the moving direction may be determined only based on the movable amount with the required amount of movement approximating zero.

5. EUV LIGHT GENERATION SYSTEM CONFIGURED TO INTEGRALLY MOVE TARGET SENSOR 80

Figure 10:
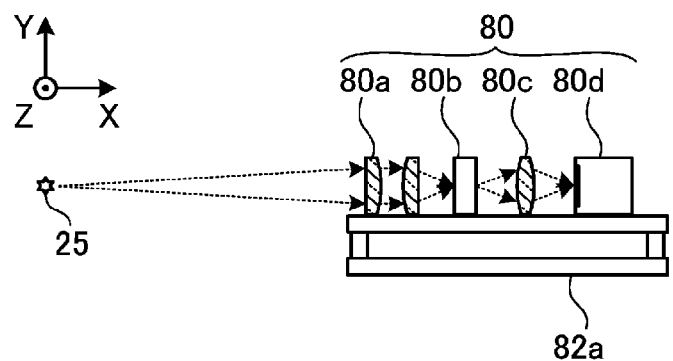
FIG. 10 schematically shows a configuration of a stage 82a in an EUV light generation system according to a third embodiment of the present disclosure.

FIG. 10 schematically shows a configuration of a stage 82a in an EUV light generation system according to a third embodiment of the present disclosure. In the third embodiment, the stage 82a is configured to integrally move an entire target sensor 80 including an imaging optical system 80a, a high-speed shutter 80b, a transfer optical system 80c, and an image sensor 80d.

The stage 82a moves the target sensor 80 so that, for example, a second axis connecting a center of the imaging optical system 80a and a center of a light receiving surface of the image sensor 80d is inclined to a first axis connecting a center of a plasma generating region 25 and the center of the imaging optical system 80a. Specifically, movement of the target sensor 80 in the third embodiment can include rotation of the target sensor 80 by a minute angle. This can change a positional relationship between a position of an image of a droplet 27a and a measurement impossible region.

Other points are similar to those in the first and second embodiments.

6. EUV LIGHT GENERATION SYSTEM CONFIGURED TO MOVE IMAGE SENSOR 80d

Figure 11:
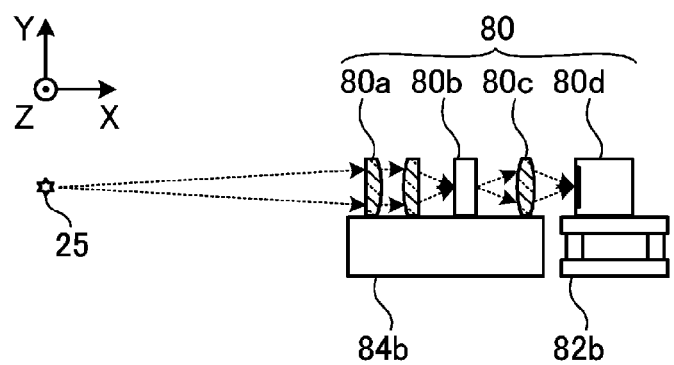
FIG. 11 schematically shows a configuration of a stage 82b in an EUV light generation system according to a fourth embodiment of the present disclosure.

FIG. 11 schematically shows a configuration of a stage 82b in an EUV light generation system according to a fourth embodiment of the present disclosure. In the fourth embodiment, an imaging optical system 80a, a high-speed shutter 80b, and a transfer optical system 80c included in a target sensor 80 are secured in a casing 81 (see FIG. 4) by a holder 84b. The stage 82b is configured to move an image sensor 80d relative to the imaging optical system 80a, the high-speed shutter 80b, the transfer optical system 80c, and the casing 81.

The stage 82b moves, for example, the image sensor 80d in a +Y direction, a −Y direction, a +Z direction, and a −Z direction. This can also change a positional relationship between a position of an image of a droplet 27a and a measurement impossible region.

Other points are similar to those in the first and second embodiments.

7. EUV LIGHT GENERATION SYSTEM CONFIGURED TO MOVE OPTICAL SYSTEM OF TARGET SENSOR 80

Figure 12:
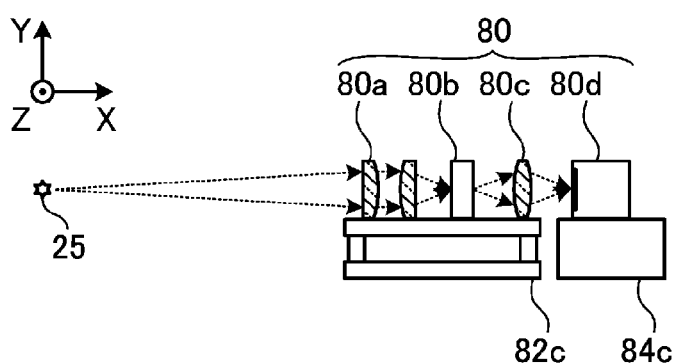
FIG. 12 schematically shows a configuration of a stage 82c in an EUV light generation system according to a fifth embodiment of the present disclosure.

FIG. 12 schematically shows a configuration of a stage 82c in an EUV light generation system according to a fifth embodiment of the present disclosure. In the fifth embodiment, an image sensor 80d is secured in a casing 81 (see FIG. 4) by a holder 84c. The stage 82c is configured to integrally move optical systems including an imaging optical system 80a, a high-speed shutter 80b, and a transfer optical system 80c relative to the image sensor 80d and the casing 81. Alternatively, the stage 82c may move a part of the optical systems including the imaging optical system 80a, the high-speed shutter 80b, and the transfer optical system 80c relative to the image sensor 80d and the casing 81.

The stage 82c moves, for example, all or a part of the optical systems in a +Y direction, a −Y direction, a +Z direction, and a −Z direction. This can also change a positional relationship between a position of an image of a droplet 27a and a measurement impossible region.

Other points are similar to those in the first and second embodiments.

8. EUV LIGHT GENERATION SYSTEM CONFIGURED TO UPDATE INFORMATION ON MEASUREMENT IMPOSSIBLE REGION

FIGS. 13A and 13B show examples of picture images in a sixth embodiment of the present disclosure. FIG. 13C shows examples of measurement impossible regions extracted based on the picture images in FIGS. 13A and 13B. In the sixth embodiment, the measurement impossible regions are extracted based on the picture images captured by a target sensor 80.

FIG. 13A shows an example of an initial picture image captured by the target sensor 80 during normal control for generating EUV light. The initial picture image includes measurement impossible regions 77d, 77e and also a plurality of droplets 27a. Thus, it may be difficult to specify the measurement impossible regions only based on the picture image in FIG. 13A.

Then, as shown in FIG. 13B, a picture image is obtained captured by the target sensor 80 with a trajectory of the droplets 27a being temporarily shifted in a +Z direction or a −Z direction. The process of temporarily shifting the trajectory of the droplets 27a is performed by a target control unit 52 controlling a target supply unit actuator 261. The target supply unit actuator 261 corresponds to a target position changing unit in the present disclosure. The process of temporarily shifting the trajectory of the droplets 27a is performed with an EUV light generation process being stopped.

A measurement control unit 51 eliminates, based on the picture image in FIG. 13A captured before changing the trajectory of the droplets 27a and the picture image in FIG. 13B captured after changing the trajectory of the droplets 27a, portions with a difference in brightness between the picture images being a predetermined value or higher. Specifically, portions corresponding to the droplets 27a in FIGS. 13A and 13B are eliminated to generate the picture image as shown in FIG. 13C. Here, "eliminate" refers to substantially equalizing brightness of pixels in the portions to brightness of background.

Then, the measurement control unit 51 extracts, from the picture image in FIG. 13C, outlines of portions with brightness of a predetermined value or lower or a predetermined value or higher. The portions surrounded by the outlines are measurement impossible regions 77d, 77e. The measurement control unit 51 generates information specifying positions and areas of the measurement impossible regions 77d, 77e and stores the information on a memory unit 53.

Other points are similar to those in the first to fifth embodiments. The information on the measurement impossible regions is used in the processes in S50 in FIG. 5 and S61 in FIG. 6.

FIGS. 14A and 14B show examples of picture images in a first variant of the sixth embodiment. FIG. 14C shows examples of measurement impossible regions extracted based on the picture image in FIG. 14B.

FIG. 14A shows an example of an initial picture image captured by the target sensor 80 during normal control for generating EUV light. The initial picture image includes measurement impossible regions 77d, 77e and also a plurality of droplets 27a. Thus, it may be difficult to specify the measurement impossible regions only based on the picture image in FIG. 14A.

Then, as shown in FIG. 14B, a picture image is obtained captured by the target sensor 80 with a trajectory of the droplets 27a being shifted outside a region in the picture image. The process of shifting the trajectory of the droplets 27a outside the region in the picture image is performed by the target control unit 52 controlling the target supply unit actuator 261.

The measurement control unit 51 extracts, from the picture image in FIG. 14B, outlines of portions with brightness of a predetermined value or lower or a predetermined value or higher. The portions surrounded by the outlines are measurement impossible regions 77d, 77e. The measurement control unit 51 generates information specifying positions and areas of the measurement impossible regions 77d, 77e and stores the information on the memory unit 53.

Other points are similar to those described with reference to FIGS. 13A to 13C.

FIGS. 15A and 15B show examples of picture images in a second variant of the sixth embodiment. FIG. 15C shows examples of measurement impossible regions extracted based on the picture image in FIG. 15B.

FIG. 15A shows an example of an initial picture image captured by the target sensor 80 during normal control for generating EUV light. The initial picture image includes measurement impossible regions 77d, 77e and also a plurality of droplets 27a. Thus, it may be difficult to specify the measurement impossible regions only based on the picture image in FIG. 15A.

Then, as shown in FIG. 15B, the measurement control unit 51 obtains a picture image captured by the target sensor 80 with a target supply unit 26 stopping output of the droplets 27a. The process of stopping the output of the droplets 27a is performed by the target control unit 52. The process of stopping the output of the droplets 27a is performed with an EUV light generation process being stopped.

The measurement control unit 51 extracts, from the picture image in FIG. 15B, outlines of portions with brightness of a predetermined value or lower or a predetermined value or higher. The portions surrounded by the outlines are measurement impossible regions 77d, 77e. The measurement control unit 51 generates information specifying positions and areas of the measurement impossible regions 77d, 77e and stores the information on the memory unit 53.

Other points are similar to those described with reference to FIGS. 13A to 13C.

9. SUPPLEMENTATION

The above descriptions are intended to be illustrative only and not restrictive. Thus, it will be apparent to those skilled in the art that modifications may be made in the embodiments of the present disclosure without departing from the scope of the appended claims.

The terms used throughout the specification and the appended claims should be interpreted as "non-limiting." For example, the term "comprising" or "comprised" should be interpreted as "not limited to what has been described as being comprised." The term "having" should be interpreted as "not limited to what has been described as having."

Further, the modifier "a/an" described in the specification and the appended claims should be interpreted to mean "at least one" or "one or more".

What is claimed is:

1. A target measuring apparatus comprising:
an image capturing unit configured to capture a picture image of a target output from a target supply unit;
a moving unit configured to move at least a part of the image capturing unit; and
a control unit configured to perform a first process of updating information on a coordinate system in the picture image based on an amount of movement of the image capturing unit by the moving unit, and a second process of measuring a parameter of the target based on the picture image captured by the image capturing unit and the information on the coordinate system.

2. The target measuring apparatus according to claim 1, wherein the information on the coordinate system includes information on an origin.

3. The target measuring apparatus according to claim 1, wherein the parameter includes a position of the target at a predetermined timing.

4. The target measuring apparatus according to claim 3, wherein the control unit is configured to further perform a third process of controlling the moving unit so as to move at least the part of the image capturing unit.

5. The target measuring apparatus according to claim 4, wherein the control unit performs the third process when set information on the position of the target at the predetermined timing is changed.

6. The target measuring apparatus according to claim 4, further comprising a memory unit configured to store information specifying a predetermined region in the picture image captured by the image capturing unit,
wherein when the set information on the position of the target at the predetermined timing is changed,
the control unit calculates information specifying a changed position of a target image in the picture image captured by the image capturing unit, and
determines whether or not the third process is to be performed based on a result of comparison between the changed position and the predetermined region.

7. The target measuring apparatus according to claim 6, wherein the control unit performs the third process so that a distance between the changed position and the predetermined region becomes larger than a predetermined value.

8. The target measuring apparatus according to claim 6, wherein the memory unit stores a movable range in which an area of the picture image captured by the image capturing unit is movable by the moving unit moving the image capturing unit, and
when the distance between the changed position and the predetermined region is smaller than the predetermined value,
the control unit calculates a first movable amount representing an amount of movement for moving the area of the picture image in a first moving direction from the current position in the area of the picture image within the movable range, and a second movable amount representing an amount of movement for moving the area of the picture image in a second moving direction from the current position in the area of the picture image within the movable range, and
determines a direction of moving the area of the picture image based on the first movable amount and the second movable amount.

9. The target measuring apparatus according to claim 8, wherein the control unit moves the area of the picture image in the first moving direction when the first movable amount is larger than the second movable amount, and moves the area of the picture image in the second moving direction when the second movable amount is larger than the first movable amount.

10. The target measuring apparatus according to claim 6 wherein the memory unit stores a movable range in which an area of the picture image captured by the image capturing unit is movable by the moving unit moving the image capturing unit, and
when the distance between the changed position and the predetermined region is smaller than the predetermined value,
the control unit calculates a first movable amount representing an amount of movement for moving the area of the picture image in a first moving direction from the current position in the area of the picture image within the movable range, and a second movable amount representing a movable amount for moving the area of the picture image in a second moving direction from the current position in the area of the picture image within the movable range,
calculates a first required amount of movement representing an amount of movement required for the distance between the changed position and the predetermined region to become larger than the predetermined value when the area of the picture image is moved in the first moving direction, and a second required amount of movement representing an amount of movement required for the distance between the changed position and the predetermined region to become larger than the predetermined value when the area of the picture image is moved in the second moving direction, and
determines a direction of moving the area of the picture image based on a first difference between the first movable amount and the first required amount of movement, and a second difference between the second movable amount and the second required amount of movement.

11. The target measuring apparatus according to claim 10, wherein the control unit moves the area of the picture image in the first moving direction when the first difference is larger than the second difference, and moves the area of the picture image in the second moving direction when the second difference is larger than the first difference.

12. The target measuring apparatus according to claim 10, wherein the control unit performs the third process when either of a first condition indicating that the first movable amount is larger than the first required amount of movement, and a second condition indicating that the second movable amount is larger than the second required amount of movement.

13. The target measuring apparatus according to claim 1, wherein the moving unit moves the entire image capturing unit.

14. The target measuring apparatus according to claim 1, wherein the image capturing unit includes an optical system configured to form a transfer image of the target, and an imaging element arranged in a position where the transfer image is formed, and
the moving unit moves the imaging element relative to the optical system.

15. The target measuring apparatus according to claim 1, wherein the image capturing unit includes an optical system configured to form a transfer image of the target, and an imaging element arranged in a position where the transfer image is formed, and
- the moving unit moves at least a part of the optical system relative to the imaging element.

16. An extreme ultraviolet light generation apparatus comprising:
- a chamber;
- a target supply unit configured to output a target into the chamber;
- an image capturing unit configured to capture a picture image of the target output from the target supply unit;
- a moving unit configured to move at least a part of the image capturing unit; and
- a control unit configured to perform a first process of updating information on a coordinate system in the picture image based on an amount of movement of the image capturing unit by the moving unit, and a second process of measuring a parameter of the target based on the picture image captured by the image capturing unit and the information on the coordinate system.

17. The extreme ultraviolet light generation apparatus according to claim 16, further comprising a memory unit configured to store information specifying a predetermined region in the picture image captured by the image capturing unit,
- wherein the parameter includes a position of the target at a predetermined timing,
- the control unit is configured to further perform a third process of controlling the moving unit so as to move at least the part of the image capturing unit, and
- when set information on the position of the target at the predetermined timing is changed,
- the control unit calculates information specifying a changed position of a target image in the picture image captured by the image capturing unit, and
- determines whether or not the third process is to be performed based on a result of comparison between the changed position and the predetermined region.

18. The extreme ultraviolet light generation apparatus according to claim 17, further comprising a target position changing unit configured to change the position of the target at the predetermined timing,
- wherein the control unit controls the target position changing unit so as to change the position of the target at the predetermined timing, and
- based on a picture image captured by the image capturing unit before changing the position of the target at the predetermined timing, and a picture image captured by the image capturing unit after changing the position of the target at the predetermined timing, the control unit generates information specifying the predetermined region and stores the information on the memory unit.

19. The extreme ultraviolet light generation apparatus according to claim 17, further comprising a target position changing unit configured to change the position of the target at the predetermined timing,
- wherein the control unit controls the target position changing unit so that the position of the target at the predetermined timing is located outside a region in the picture image captured by the image capturing unit, and
- based on the picture image with the position of the target at the predetermined timing being located outside the region in the picture image captured by the image capturing unit, the control unit generates information specifying the predetermined region and stores the information on the memory unit.

20. The extreme ultraviolet light generation apparatus according to claim 17, wherein the control unit controls the target supply unit so as to stop output of the target, and
- based on the picture image captured by the image capturing unit with the target supply unit stopping output of the target, the control unit generates information specifying the predetermined region and stores the information on the memory unit.

* * * * *